US012601947B2

(12) United States Patent
Luo et al.

(10) Patent No.: US 12,601,947 B2
(45) Date of Patent: Apr. 14, 2026

(54) DISPLAY MODULE, DISPLAY DEVICE AND DRIVING CIRCUIT BOARD

(71) Applicants: BEIJING BOE DISPLAY TECHNOLOGY CO., LTD., Beijing (CN); BOE TECHNOLOGY GROUP CO., LTD., Beijing (CN)

(72) Inventors: Wenqian Luo, Beijing (CN); Weibiao Geng, Beijing (CN); Xin Gai, Beijing (CN); Jingrui Ren, Beijing (CN); Fanglin Li, Beijing (CN); Qian Cheng, Beijing (CN); Chunlei Xiao, Beijing (CN); Tianyang Han, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 175 days.

(21) Appl. No.: 18/580,614

(22) PCT Filed: May 18, 2022

(86) PCT No.: PCT/CN2022/093657
§ 371 (c)(1),
(2) Date: Jan. 19, 2024

(87) PCT Pub. No.: WO2023/220985
PCT Pub. Date: Nov. 23, 2023

(65) Prior Publication Data
US 2025/0076714 A1     Mar. 6, 2025

(51) Int. Cl.
*H05K 1/18* (2026.01)
*G02F 1/1345* (2006.01)
(Continued)

(52) U.S. Cl.
CPC ....... *G02F 1/13454* (2013.01); *G09G 3/3648* (2013.01); *H05K 1/189* (2013.01);
(Continued)

(58) Field of Classification Search
CPC .............. G02F 1/13454; G09G 3/3648; G09G 2310/08; H05K 1/189; H05K 2201/10136
(Continued)

(56) References Cited

U.S. PATENT DOCUMENTS 5,777,610 A * 7/1998 Sugimoto .............. H05K 1/147
345/206
6,424,400 B1 7/2002 Kawasaki
(Continued)

FOREIGN PATENT DOCUMENTS

CN 1220407 A 6/1999
CN 1294730 A 5/2001
(Continued)

*Primary Examiner* — Binh B Tran
(74) *Attorney, Agent, or Firm* — XSENSUS LLP

(57) ABSTRACT

A display module includes a display panel, a driving circuit board, a flexible printed circuit and a driving chip. The driving circuit board includes a circuit board body and at least one bonding component. The circuit board body has a first main surface and a second main surface opposite to each other. A bonding component is located on the first main surface. The circuit board body is provided with at least one receiving structure therein. A receiving structure has at least an opening in the first main surface. The driving chip is installed on the flexible printed circuit, and is located on a side of the flexible printed circuit proximate to the driving circuit board. An orthographic projection of the driving chip on a first reference plane is located inside an orthographic projection of the opening on the first reference plane.

19 Claims, 10 Drawing Sheets

(51) Int. Cl.
  *G09G 3/36*     (2006.01)
  *H05K 1/189*    (2026.01)

(52) U.S. Cl.
  CPC .................... *G09G 2310/08* (2013.01); *H05K 2201/10136* (2013.01)

(58) Field of Classification Search
  USPC ......................................................... 361/749
  See application file for complete search history.

(56) References Cited

U.S. PATENT DOCUMENTS

| | | | |
|---|---|---|---|
| 2008/0165483 A1 | 7/2008 | Tanaka et al. | |
| 2013/0161661 A1* | 6/2013 | Akamatsu .............. | H10H 29/10 |
| | | | 361/783 |
| 2018/0098427 A1* | 4/2018 | Park ....................... | H05K 1/147 |
| 2018/0217442 A1 | 8/2018 | Ma et al. | |

FOREIGN PATENT DOCUMENTS

| | | | |
|---|---|---|---|
| CN | 101211027 A | 7/2008 |
| CN | 205594261 U | 9/2016 |
| CN | 208689312 U | 4/2019 |
| CN | 213814453 U | 7/2021 |
| EP | 0888036 A1 | 12/1998 |
| JP | H10199929 A | 7/1998 |
| JP | 2002-289764 A | 10/2002 |

* cited by examiner

400

300

500

300/310

510

DISPLAY MODULE, DISPLAY DEVICE AND DRIVING CIRCUIT BOARD

CROSS-REFERENCE TO RELATED APPLICATION

This application is a national phase entry under 35 USC 371 of International Patent Application No. PCT/CN2022/093657 filed on May 18, 2022, which is incorporated herein by reference in its entirety.

TECHNICAL FIELD

The present disclosure relates to the field of display technologies, and in particular, to a display module, a display device and a driving circuit board.

BACKGROUND

In the related art, a display module generally has wide side bezel(s), which affects the visual effect of the display module.

SUMMARY

In an aspect, a display module is provided. The display module includes a display panel, a driving circuit board, a flexible printed circuit and a driving chip. The driving circuit board includes a circuit board body and at least one bonding component. The circuit board body has a first main surface and a second main surface opposite to each other. A bonding component is located on the first main surface. The circuit board body has a first edge and a second edge opposite to each other, and the first edge is closer to a bonding side of the display panel than the second edge. The circuit board body is provided with at least one receiving structure therein. A receiving structure has at least an opening in the first main surface, and the opening of the receiving structure is closer to the first edge than the bonding component. An end of the flexible printed circuit is bonded to the bonding side of the display panel, and another end of the flexible printed circuit is bonded to the bonding component. The driving chip is installed on the flexible printed circuit, and is located on a side of the flexible printed circuit proximate to the driving circuit board. An orthographic projection of the driving chip on a first reference plane is located inside an orthographic projection of the opening on the first reference plane. The first reference plane is a plane parallel to the first main surface.

In some embodiments, the driving chip passes through the opening, and is at least partially located in the receiving structure.

In some embodiments, the receiving structure penetrates the circuit board body in a direction from the first main surface to the second main surface.

In some embodiments, a distance between the opening and the first edge is less than a distance between the opening and the second edge.

In some embodiments, the first edge includes a plurality of sub-edges that are spaced apart from each other. The receiving structure includes a sidewall surface connected between two adjacent sub-edges, and at least a portion of the sidewall surface extends in a direction towards the second edge.

In some embodiments, the two adjacent sub-edges include a first sub-edge and a second sub-edge. The sidewall surface includes a first wall surface, a second wall surface and a third wall surface. An end of the first wall surface is connected to an end of the first sub-edge proximate to the second sub-edge, and another end of the first wall surface extends in the direction towards the second edge. An end of the second wall surface is connected to an end of the second sub-edge proximate to the first sub-edge, and another end of the second wall surface extends in the direction towards the second edge. An end of the third wall surface is connected to an end of the first wall surface away from the first sub-edge, and another end of the third wall surface is connected to an end of the second wall surface away from the second sub-edge.

In some embodiments, in a direction from the first edge to the second edge, a distance between the first wall surface and the second wall surface is reduced.

In some embodiments, the first wall surface and the third wall surface have a first included angle therebetween, and the first included angle is an obtuse angle; the second wall surface and the third wall surface have a second included angle therebetween, and the second included angle is an obtuse angle; and/or the first wall surface and the first sub-edge have a third included angle therebetween, and the third included angle is an obtuse angle; the second wall surface and the second sub-edge have a fourth included angle therebetween, and the fourth included angle is an obtuse angle.

In some embodiments, the bonding component includes a plurality of connection pins that are sequentially arranged at intervals in a direction parallel to the second edge. At least some of the connection pins are located between the third wall surface and the second edge. In an extending direction of the second edge, the bonding component extends beyond at least one end of the third wall surface.

In some embodiments, in a direction from the first edge to the second edge, a distance between the bonding component and the third wall surface is greater than a distance between the bonding component and the second edge.

In some embodiments, the circuit board body further includes a plurality of signal wirings. At least one signal wiring includes first portion signal wirings, second portion signal wirings and a third portion signal wiring. An extending direction of a first portion signal wiring is same as an extending direction of an orthographic projection of the first edge on the first reference plane. A second portion signal wiring has a first second portion signal wiring connection end and a second second portion signal wiring connection end. The first second portion signal wiring connection end is electrically connected to the first portion signal wiring. The third portion signal wiring is electrically connected to the second second portion signal wiring connection end. An extending direction of the third portion signal wiring is same as an extending direction of an orthographic projection of the third wall surface on the first reference plane. Moreover, the second portion signal wiring and the first portion signal wiring have a fifth included angle therebetween, and the fifth included angle is an obtuse angle. The second portion signal wiring and the third portion signal wiring have a sixth included angle therebetween, and the sixth included angle is an obtuse angle.

In some embodiments, the driving circuit board further includes a plurality of electronic elements. The plurality of electronic elements include a connector; and a timing controller electrically connected to the connector. One of the connector and the timing controller is located on the first main surface, and another one of the connector and the timing controller is located on the second main surface. An orthographic projection of the connector on the first reference plane and an orthographic projection of the timing controller on the first reference plane have a first distance therebetween, and a value of the first distance is in a range of 8 mm to 12 mm, inclusive.

In some embodiments, the circuit board body further includes a driving signal wiring. The plurality of electronic elements further include a first filter and a second filter. The first filter is arranged adjacent to the bonding component. An input end of the first filter is electrically connected to an end of the driving signal wiring, and an output end of the first filter is electrically connected to the bonding component. The second filter is arranged adjacent to the timing controller. An input end of the second filter is electrically connected to the timing controller, and an output end of the second filter is electrically connected to an end of the driving signal wiring away from the first filter.

In some embodiments, the first filter is located on a side of the bonding component away from the second edge, and is located on the second main surface.

In some embodiments, the driving signal wiring includes a first wiring segment. The first wiring segment includes a first portion driving signal wiring, a second portion driving signal wiring and a third portion driving signal wiring. An extending direction of the first portion driving signal wiring is same as an extending direction of an orthographic projection of the first edge on the first reference plane. The second portion driving signal wiring has a first second portion driving signal wiring connection end and a second second portion driving signal wiring connection end. The first second portion driving signal wiring connection end is electrically connected to the first portion driving signal wiring. The third portion driving signal wiring is electrically connected to the second second portion driving signal wiring connection end. An extending direction of the third portion driving signal wiring is same as an extending direction of an orthographic projection of the third wall surface on the first reference plane. Moreover, the second portion driving signal wiring and the first portion driving signal wiring have a seventh included angle therebetween, and the seventh included angle is an obtuse angle. The second portion driving signal wiring and the third portion driving signal wiring have an eighth included angle therebetween, and the eighth included angle is an obtuse angle.

In some embodiments, the circuit board body further includes a power signal wiring. The plurality of electronic elements further include a power driving chip and a third filter. The power driving chip is electrically connected to the connector. The third filter is arranged adjacent to the bonding component. An input end of the third filter is electrically connected to the power driving chip through the power signal wiring, and an output end of the third filter is electrically connected to the bonding component.

In some embodiments, the third filter is located on a side of the bonding component away from the second edge, and is located on the second main surface.

In some embodiments, the power signal wiring includes a second wiring segment and/or a third wiring segment. The second wiring segment includes a first portion power signal wiring, a second portion power signal wiring and a third portion power signal wiring. An extending direction of the first portion power signal wiring is same as an extending direction of an orthographic projection of the first edge on the first reference plane. The second portion power signal wiring has a first second portion power signal wiring connection end and a second second portion power signal wiring connection end. The first second portion power signal wiring connection end is electrically connected to the first portion power signal wiring. The third portion power signal wiring is electrically connected to the second second portion power signal wiring connection end. An extending direction of the third portion power signal wiring is same as an extending direction of an orthographic projection of the third wall surface on the first reference plane. Moreover, the second portion power signal wiring and the first portion power signal wiring have a ninth included angle therebetween, and the ninth included angle is an obtuse angle. The second portion power signal wiring and the third portion power signal wiring have a tenth included angle therebetween, and the tenth included angle is an obtuse angle. The third wiring segment includes a fourth portion power signal wiring, a fifth portion power signal wiring, a sixth portion power signal wiring, a seventh portion power signal wiring and an eighth portion power signal wiring. An extending direction of the fourth portion power signal wiring is same as an extending direction of an orthographic projection of the first sub-edge on the first reference plane. The fifth portion power signal wiring has a first fifth portion power signal wiring connection end and a second fifth portion power signal wiring connection end. The first fifth portion power signal wiring connection end is electrically connected to the fourth portion power signal wiring. The sixth portion power signal wiring has a first sixth portion power signal wiring connection end and a second sixth portion power signal wiring connection end. The first sixth portion power signal wiring connection end is electrically connected to the second fifth portion power signal wiring connection end. An extending direction of the sixth portion power signal wiring is same as the extending direction of the orthographic projection of the third wall surface on the first reference plane. The seventh portion power signal wiring has a first seventh portion power signal wiring connection end and a second seventh portion power signal wiring connection end. The first seventh portion power signal wiring connection end is electrically connected to the second sixth portion power signal wiring connection end. The eighth portion power signal wiring is electrically connected to the second seventh portion power signal wiring connection end. An extending direction of the eighth portion power signal wiring is same as an extending direction of an orthographic projection of the second sub-edge on the first reference plane. Moreover, the fifth portion power signal wiring and the fourth portion power signal wiring have an eleventh included angle therebetween, and the eleventh included angle is an obtuse angle. The fifth portion power signal wiring and the sixth portion power signal wiring have a twelfth included angle therebetween, and the twelfth included angle is an obtuse angle. The seventh portion power signal wiring and the sixth portion power signal wiring have a thirteenth included angle therebetween, and the thirteenth included angle is an obtuse angle. The seventh portion power signal wiring and the eighth portion power signal wiring have a fourteenth included angle therebetween, and the fourteenth included angle is an obtuse angle.

In some embodiments, the circuit board body further has a third edge and a fourth edge opposite to each other. An end of the first edge is connected to the third edge, and another end of the first edge is connected to the fourth edge. An end of the second edge is connected to an end of the third edge away from the first edge, and another end of the second edge is connected to an end of the fourth edge away from the first edge. The at least one receiving structure includes a plurality of receiving structures, and the plurality of receiving structures are spaced apart along an extending direction of the second edge. The plurality of receiving structures include a first receiving structure and a second receiving structure, and the second receiving structure is closer to the third edge than the first receiving structure. The at least one bonding component includes a plurality of bonding components, and the plurality of bonding components are spaced apart along the extending direction of the second edge. The plurality of bonding components include a first bonding component and a second bonding component, and the second bonding component is closer to the third edge than the first bonding component. At least a portion of the first bonding component is located between the first receiving structure and the second edge, and at least a portion of the second bonding component is located between the second receiving structure and the second edge. The connector and the timing controller are located among the first receiving structure, the second receiving structure, the first bonding component and the second bonding component. The power driving chip is located on a side of the second receiving structure proximate to the third edge.

In another aspect, a display device is provided. The display device includes the above display module.

In yet another aspect, a driving circuit board is provided. The driving circuit board includes a circuit board body and a bonding component. The circuit board body has a first main surface and a second main surface opposite to each other. The bonding component is located on the first main surface. The circuit board body has a first edge and a second edge opposite to each other, and the first edge is configured to be closer to a bonding side of a display panel than the second edge. The circuit board body is provided with a receiving structure therein. The receiving structure has at least an opening in the first main surface, and the opening of the receiving structure is closer to the first edge than the bonding component.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method, and an actual timing of a signal involved in the embodiments of the present disclosure.

DETAILED DESCRIPTION

Figure 1A:
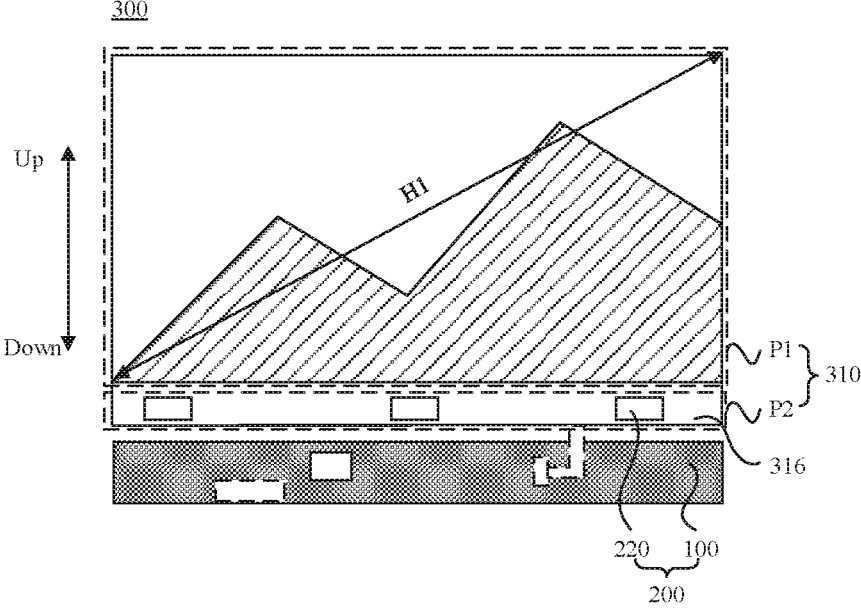
FIG. 1A is a structural diagram of a display module.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to."

In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the term "connected" and derivatives thereof may be used. For example, the term "connected" may be used in the description of some embodiments to indicate that two or more components are in direct physical or electrical contact with each other.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The use of the phrase "applicable to" or "configured to" herein means an open and inclusive expression.

As used herein, the term such as "parallel," "perpendicular" or "equal" includes a stated condition and condition(s) similar to the stated condition. The similar condition(s) are within an acceptable range of deviation as determined by a person of ordinary skill in the art, considering measurement in question and errors associated with measurement of a particular quantity (i.e., limitations of a measurement system). For example, the term "parallel" includes "absolutely parallel" and "approximately parallel", and for the phrase "approximately parallel", an acceptable range of deviation may be, for example, within 5°. The term "perpendicular" includes "absolutely perpendicular" and "approximately perpendicular", and for the phrase "approximately perpendicular", an acceptable range of deviation may also be, for example, within 5°. The term "equal" includes "absolutely equal" and "approximately equal", and for the phrase "approximately equal", an acceptable range of deviation may be that, for example, a difference between two that are equal to each other is less than or equal to 5% of any one of the two.

It will be understood that when a layer or element is described as being on another layer or substrate, the layer or element may be directly on the another layer or substrate, or intermediate layer(s) may exist between the layer or element and the another layer or substrate.

FIG. 1A is a structural diagram of a display module.

As shown in FIG. 1A, a display module 300 is provided. The display module 300 includes a display panel 310 and a circuit board assembly 200.

It will be understood that the display panel 310 is used for displaying image information. For example, the display panel 310 may be used for displaying dynamic image information, such as videos or game pictures. The display panel 310 may also be used for displaying static image information, such as pictures or photographs.

In some examples, the display panel 310 is a full high definition (FHQ) display panel.

For example, as shown in FIG. 1A, the display panel 310 has a display region P1 and peripheral region(s) P2. The display region P1 is used for displaying image information, and the peripheral region(s) P2 are used for placing wiring(s) or driving circuit(s) electrically connected to the display region P1.

For example, the peripheral region P2 is located on a side of the display region P1, and is arranged adjacent to the display region P1. In some examples, there may be one or more peripheral regions P2. In a case where there are a plurality of peripheral regions P2, the plurality of peripheral regions P2 are arranged around the display region P1.

In some examples, as shown in FIG. 1A, the peripheral region P2 is located below the display region P1. It will be understood that the peripheral region P2 is located below the display region P1, i.e., the peripheral region P2 is closer to the ground than the display region P1 in the use state.

It will be noted that in the drawings (e.g., FIG. 1A) of the present disclosure, edges of a dashed box are separated from edges of the display region P1 or edges of the peripheral region P2 only for the convenience of exhibiting the display region P1 or the peripheral region P2, which does not further limit the display region P1 and the peripheral region P2.

In some examples, as shown in FIG. 1A, a size (i.e., a length H1 of a diagonal line of the display region P1) of the display panel 310 may be 14 inches, 15.6 inches, 17.3 inches, or 18.5 inches.

In some examples, the display panel 310 is a liquid crystal display (LCD), an organic light-emitting diode (OLED) display, or a quantum dot light-emitting diode (QLED) display.

Figure 1B:
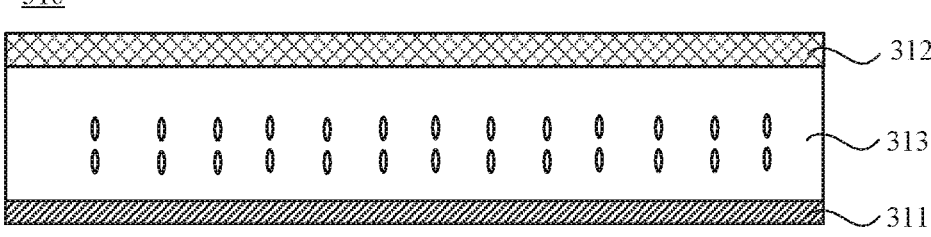
FIG. 1B is a structural diagram of a display panel.
Figure 1C:
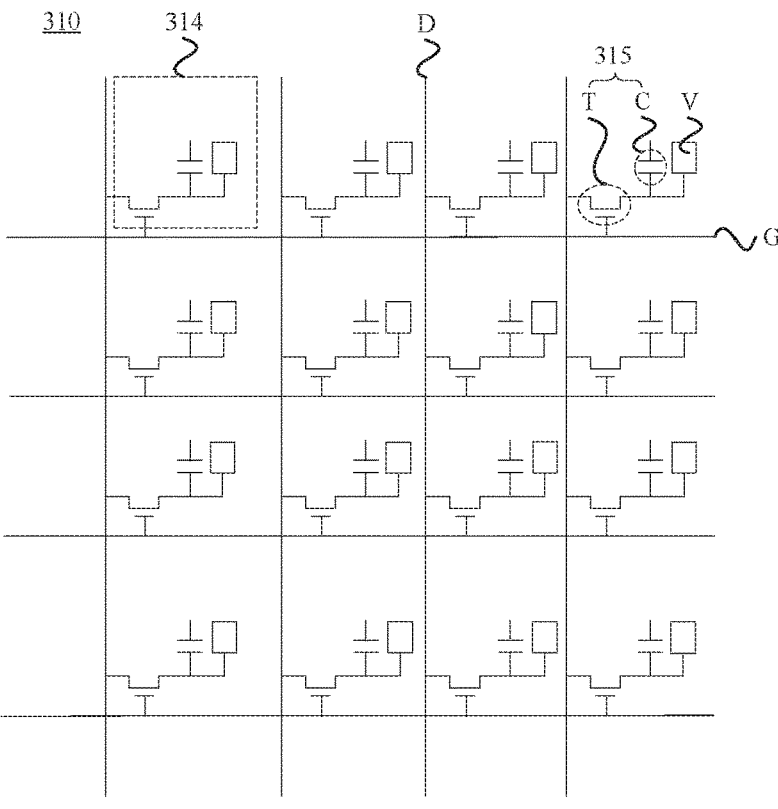
FIG. 1C is a structural diagram of pixel driving circuits.

FIG. 1B is a structural diagram of a display panel. FIG. 1C is a structural diagram of pixel driving circuits. The display panel 310 will be exemplarily described below with reference to FIGS. 1B and 1C.

In an example where the display panel 310 is the liquid crystal display, as shown in FIG. 1B, the display panel 310 includes an array substrate 311, an opposite substrate 312, and a liquid crystal layer 313 located between the array substrate 311 and the opposite substrate 312.

The display module 300 further includes a backlight module (not shown in the figures). The display panel 310 is located on a light exit side of the backlight module, and light emitted from the backlight module travels in a direction from the array substrate 311 to the opposite substrate 312.

In some examples, the backlight module is a direct-type backlight module. In some other examples, the backlight module is a side-type backlight module.

It will be understood that the light emitted from the backlight module is able to pass through the array substrate 311 and reach the liquid crystal layer 313. The liquid crystal layer 313 includes liquid crystal molecules. By controlling a deflection angle of the liquid crystal molecule, an intensity of the light passing through the liquid crystal layer 313 and reaching the opposite substrate 312 is able to be controlled, thereby realizing an image display function of the display panel 310.

In some examples, the opposite substrate 312 includes red filters, green filters and blue filters. By controlling an intensity of light reaching the red filters, an intensity of light reaching the green filters and an intensity of light reaching the blue filters, red light, green light and blue light with different intensities may be obtained, so that the display panel 310 is able to display color image(s).

As shown in FIG. 1C, the display panel 310 includes a plurality of sub-pixels 314, and the plurality of sub-pixels 314 are arranged in an array. It will be understood that the number of the sub-pixels 314 is not further limited.

As shown in FIG. 1C, the sub-pixel 314 includes a pixel driving circuit 315 and a pixel electrode V, and the pixel driving circuit 315 is electrically connected to the pixel electrode V. For example, the display panel 310 further includes a plurality of gate lines G and a plurality of data lines D. A gate line G is electrically connected to pixel driving circuits 315 in a row of sub-pixels 314, and a data line D is electrically connected to pixel driving circuits 315 in a column of sub-pixels 314.

In some examples, the plurality of gate lines G, the plurality of data lines D, pixel driving circuits 315 and pixel electrodes V are located on the array substrate 311.

For example, as shown in FIG. 1C, the pixel driving circuit 315 includes a thin film transistor (TFT) T and a storage capacitor C. The gate line G is electrically connected to a gate of the thin film transistor T, and the data line D is electrically connected to a source of the thin film transistor T.

The display panel 310 further includes a common electrode, and an electric field is able to be formed between the common electrode and each pixel electrode V. By controlling a voltage value of each pixel electrode V, a strength of the electric field formed between the common electrode and each pixel electrode V is able to be controlled, thereby controlling the deflection angle of the liquid crystal molecule in the liquid crystal layer 313.

In some examples, the common electrode is disposed on the array substrate 311. In some other examples, the common electrode is disposed on the opposite substrate 312.

In some examples, signals provided from the plurality of gate lines G and the plurality of data lines D to the pixel driving circuits 315 may be controlled to control the voltage values of the pixel electrodes V. For example, when a scan signal is input to a gate line G, thin film transistors T electrically connected to this gate line G are turned on. Data signals from the plurality of data lines D are transmitted to respective pixel electrodes V through respective thin film transistors T that are turned-on, thereby completing data writing of a row of sub-pixels 314. After the scan signals are respectively input to the gate lines G, data writing of all of the sub-pixels 314 is completed, thereby realizing display of a frame of image.

The circuit board assembly 200 will be exemplarily described below. It will be understood that the circuit board assembly 200 is electrically connected to the display panel 310 for driving the display panel 310, thereby realizing the image display function of the display panel 310.

In some implementations, as shown in FIG. 1A, the circuit board assembly 200 includes a driving circuit board 100 and driving chip(s) 220. For example, in a case where the display panel 310 is the liquid crystal display, the driving chip 220 is a source driving chip (i.e., source driver integrated circuit, SIC), and the SIC is electrically connected to sources of thin film transistors T through the data lines D. For example, the SIC has a plurality of channels, and the number of channels is the same as the number of the data lines D.

The display panel 310 further includes a glass substrate 316. In some implementations, as shown in FIG. 1A, the driving chip(s) 220 are located in the peripheral region P2 of the display panel 310, and are bonded to the glass substrate 316 in the peripheral region P2 by using a chip on glass (COG) process. The driving circuit board 100 is arranged adjacent to the peripheral region P2 of the display panel 310, and is electrically connected to the display panel 310.

It is found that the driving chip(s) 220 are disposed in peripheral region P2 of the display panel 310, so that a width of the peripheral region P2 of the display panel 310 is increased, and thus a width of a side bezel (e.g., lower bezel) of the display panel 310 is increased, thereby affecting the visual effect of the display panel 310.

In some examples, a side of the display panel 310 proximate to the driving circuit board 100 may be referred to as a display port (DP) side. That is, the driving chip(s) 220 are disposed in the peripheral region P2 of the display panel 310, so that a bezel width of the DP side of the display panel 310 is increased.

Figure 1D:
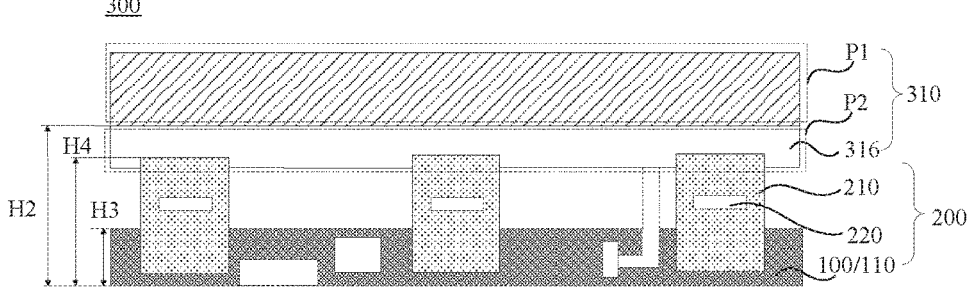
FIG. 1D is a structural diagram of a display module.
Figure 1E:
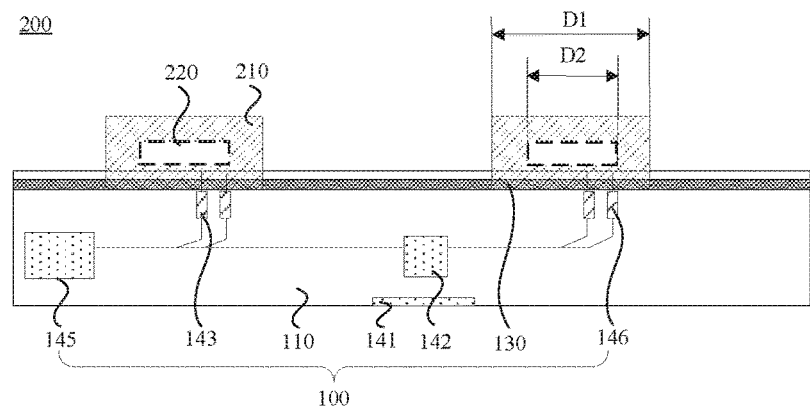
FIG. 1E is a structural diagram of a circuit board assembly.

FIG. 1D is a structural diagram of a display module. FIG. 1E is a structural diagram of a circuit board assembly.

As shown in FIG. 1D, in some other implementations, the circuit board assembly 200 further includes flexible printed circuit(s) (FPC) 210 in addition to the driving chip(s) 220 and the driving circuit board 100.

It will be understood that the flexible printed circuit 210 is a bendable printed circuit board with a flexible substrate (e.g., polyimide or polyester film) as a base material.

For example, as shown in FIG. 1E, the driving circuit board 100 includes a circuit board body 110, and a bonding component 130 is disposed on the circuit board body 110. In some examples, the bonding component 130 is located on a side of the circuit board body 110 proximate to the display panel 310.

An end of the flexible printed circuit 210 is bonded to a bonding side of the display panel 310, and another end of the flexible printed circuit 210 is bonded to the bonding component 130. In some examples, as shown in FIG. 1D, the bonding side of the display panel 310 is located in the peripheral region P2, and an end of the flexible printed circuit 210 away from the bonding component 130 is bonded to the glass substrate 316 in the peripheral region P2.

As shown in FIG. 1E, the driving chip 220 is installed on the flexible printed circuit 210. For example, the driving chip 220 may be installed on the flexible printed circuit 210 by using a chip on film (COF) process.

In some examples, as shown in FIG. 1E, a width D1 of the flexible printed circuit 210 is greater than a width D2 of the driving chip 220, so that the plurality of channels of the driving chip 220 are able to be electrically connected to the flexible printed circuit 210.

It will be understood that the larger the number of channels of the driving chip 220, the larger the width D2 of the driving chip 220, and the larger the width D1 of the flexible printed circuit 210. In some examples, the number of channels of the driving chip 220 is 960, and the width D1 of the flexible printed circuit 210 is 42 mm. In some other examples, the number of channels of the driving chip 220 is 1440, and the width D1 of the flexible printed circuit 210 is 63 mm.

In the above implementations, the driving chip(s) 220 do not need to be disposed in the peripheral region P2 of the display panel 310, so that the width of the peripheral region P2 is reduced, thereby reducing the width of the side bezel (e.g., lower bezel) of the display panel 310.

However, it is found that, as shown in FIG. 1D, in the above implementations, an additional longitudinal space (i.e., an additional space in a direction from the display panel 310 to the driving circuit board 100) is required to be provided to receive the driving chip(s) 220, so that a width H4 of the circuit board assembly 200 is increased. Since the flexible printed circuit 210 in the circuit board assembly 200 is bonded to the bonding side of the display panel 310, the width H4 of the circuit board assembly 200 is increased, so that a width H2 of a side bezel (e.g., lower bezel) of the display module 300 is increased, thereby affecting the visual effect of the display module 300.

It will be noted that, as shown in FIG. 1D, the width H2 of the side bezel of the display module 300 is a distance between a side edge of the peripheral region P2 proximate to the display region P1 and a side edge of the circuit board assembly 200 away from the display panel 310.

For example, as shown in FIG. 1D, in the above implementations, the width H2 of the side bezel of the display module 300 is 30.6 mm. A width H3 of the circuit board body 110 is 13 mm.

Figure 2A:
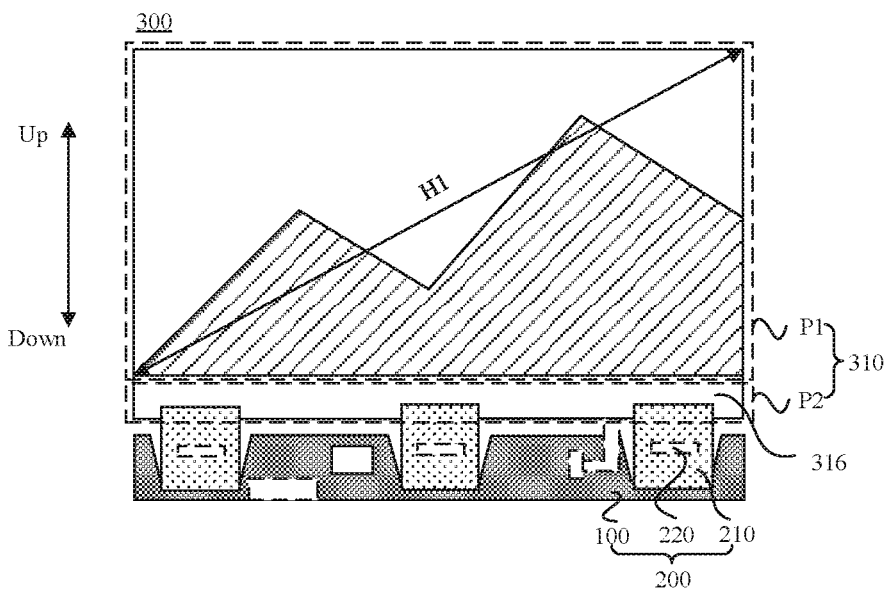
FIG. 2A is a structural diagram of a display module, in accordance with some embodiments.
Figure 2B:
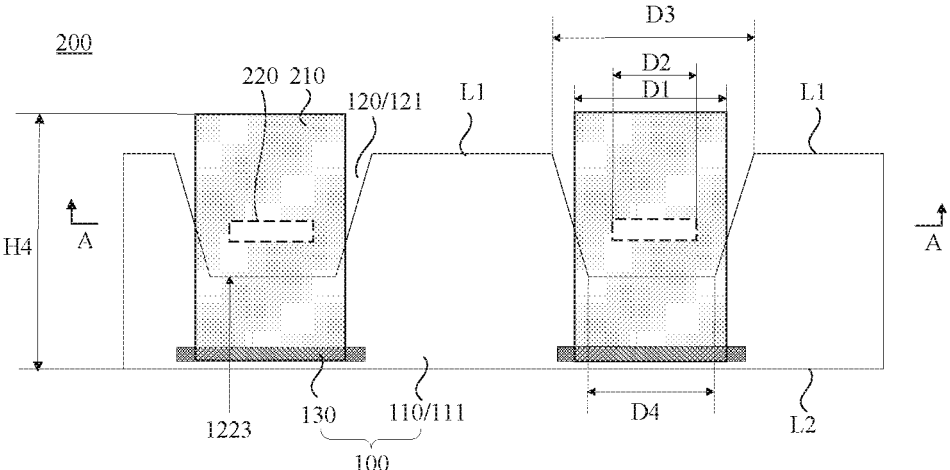
FIG. 2B is a structural diagram of a circuit board assembly, in accordance with some embodiments.
Figure 2C:
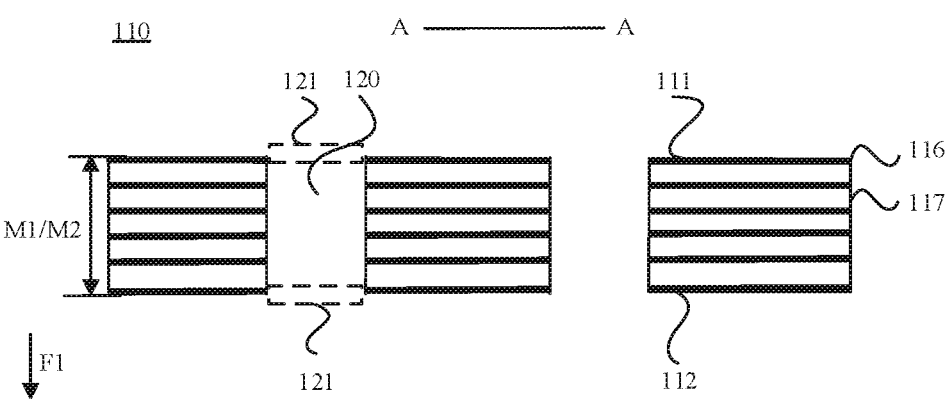
FIG. 2C is a sectional view of a circuit board body in FIG. 2B taken along the A-A direction.
Figure 2D:
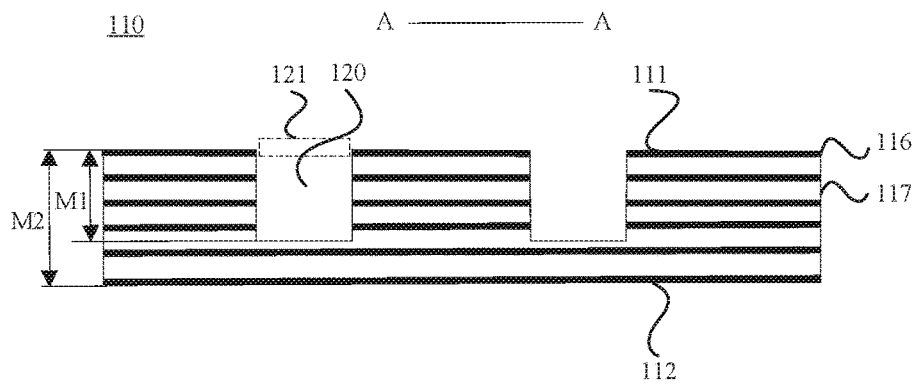
FIG. 2D is another sectional view of a circuit board body in FIG. 2B taken along the A-A direction.

FIG. 2A is a structural diagram of a display module, in accordance with some embodiments. FIG. 2B is a structural diagram of a circuit board assembly, in accordance with some embodiments. FIG. 2C is a sectional view of a circuit board body in FIG. 2B taken along the A-A direction. FIG. 2D is another sectional view of a circuit board body in FIG. 2B taken along the A-A direction.

In order to reduce the width H2 of the side bezel of the display module 300 to improve the visual effect of the display module 300, as shown in FIG. 2A, embodiments of the present disclosure provide a display module 300.

In some embodiments, as shown in FIG. 2A, the display module 300 includes a display panel 310 and a circuit board assembly 200. The circuit board assembly 200 includes a driving circuit board 100, flexible printed circuit(s) 210 and driving chip(s) 220. That is, the display module 300 includes the display panel 310, the driving circuit board 100, the flexible printed circuit(s) 210 and the driving chip(s) 220.

It will be noted that the display panel 310, the flexible printed circuit 210, the driving chip 220, and a connection relationship between the flexible printed circuit 210 and the driving chip 220 and widths of the flexible printed circuit 210 and the driving chip 220 are exemplarily described above, and will not be repeated here. The driving circuit board 100 will be exemplarily described below.

In some examples, as shown in FIG. 2B, the driving circuit board 100 includes a circuit board body 110 and bonding component(s) 130.

As shown in FIG. 2C, the circuit board body 110 has a first main surface 111 and a second main surface 112 opposite to each other. For example, the first main surface 111 and the second main surface 112 are smooth or approximately smooth planes, and the first main surface 111 is parallel to or approximately parallel to the second main surface 112.

In some examples, the circuit board body 110 is a printed circuit board (PCB). In some examples, the circuit board body 110 is a multi-layer PCB. For example, the circuit board body 110 may be a 4-layer PCB, a 6-layer PCB, an 8-layer PCB, or a 10-layer PCB.

In some examples, as shown in FIG. 2C, the circuit board body 110 includes a plurality of conductive layers 116 and a plurality of dielectric layers 117. The plurality of conductive layers 116 and the plurality of dielectric layers 117 are alternately stacked, and are located between the first main surface 111 and the second main surface 112. The dielectric layer 117 functions to electrically isolate two adjacent conductive layers 116.

For example, the conductive layer 116 may be made of copper, aluminum, or silver. The plurality of conductive layers 116 may be made of the same material or different materials. The dielectric layer 117 may be made of resin, glass fiber, or ceramic. The plurality of dielectric layers 117 may be made of the same material or different materials.

In some examples, the first main surface 111, the second main surface 112, and the plurality of conductive layers 116 are electrically connected by metallized vias through which a signal is able to be transmitted among the first main surface 111, the second main surface 112 and the plurality of conductive layers 116.

As shown in FIG. 2B, the bonding component 130 is located on the first main surface 111. It will be understood that the bonding component 130 is able to be bonded to the flexible printed circuit 210. For example, as shown in FIGS. 2A and 2B, an end of the flexible printed circuit 210 is bonded to the bonding component 130, and another end of the flexible printed circuit 210 is bonded to a bonding side of the display panel 310.

In some examples, as shown in FIG. 2A, the bonding side of the display panel 310 is located in the peripheral region P2, and the end of the flexible printed circuit 210 away from the bonding component 130 is bonded to the glass substrate 316 in the peripheral region P2.

As shown in FIG. 2B, the circuit board body 110 has a first edge L1 and a second edge L2 opposite to each other, and the first edge L1 is closer to the bonding side of the display panel 310 than the second edge L2. In some examples, the first edge L1 is parallel to or approximately parallel to the second edge L2.

As shown in FIG. 2B, the circuit board body 110 is provided with receiving structure(s) 120 therein. As shown in FIG. 2C, the receiving structure 120 has at least an opening 121 in the first main surface 111. Moreover, as shown in FIG. 2B, the opening 121 of the receiving structure 120 is closer to the first edge L1 than the bonding component 130.

For example, the opening 121 may have a circular shape, an oval shape, a rectangular shape, a trapezoidal shape, a triangular shape, or other irregular shape.

In some examples, as shown in FIG. 2C, the receiving structure 120 has the opening 121 in the first main surface 111 and an opening 121 in the second main surface 112. That is, in a direction F1 from the first main surface 111 to the second main surface 112, a depth M1 of the receiving structure 120 is the same as a thickness M2 of the circuit board body 110. For example, the shape and an area of the opening 121 in first main surface 111 are respectively the same as or respectively approximately the same as a shape and an area of the opening 121 in the second main surface 112.

In some other examples, as shown in FIG. 2D, the receiving structure 120 has the opening 121 in the first main surface 111, and does not have the opening 121 in the second main surface 112. That is, in the direction from the first main surface 111 to the second main surface 112, the depth M1 of the receiving structure 120 is less than the thickness M2 of the circuit board body 110.

Figure 2E:
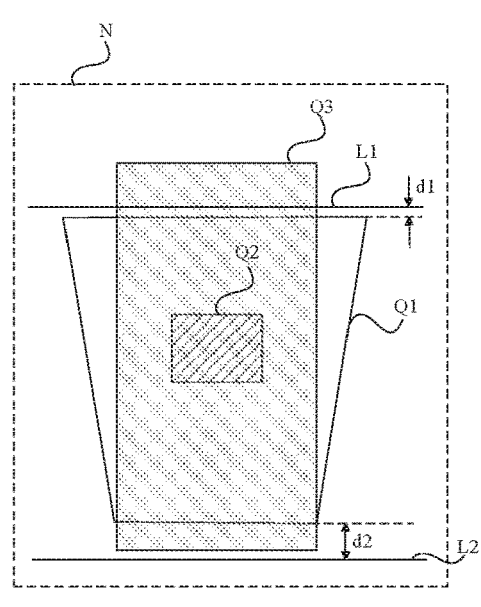
FIG. 2E is a relationship diagram of projection positions, in accordance with some embodiments.
Figure 2F:
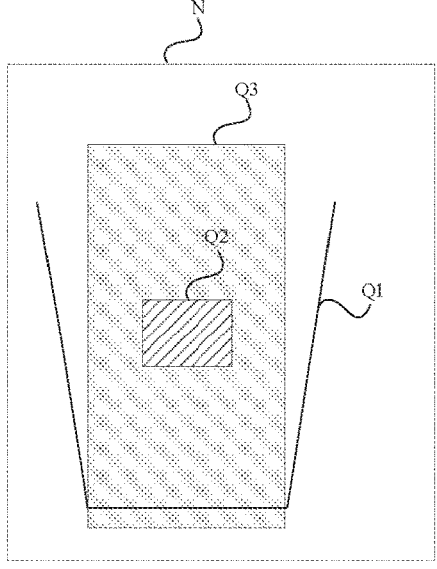
FIG. 2F is a relationship diagram of projection positions, in accordance with some other embodiments.
Figure 2G:
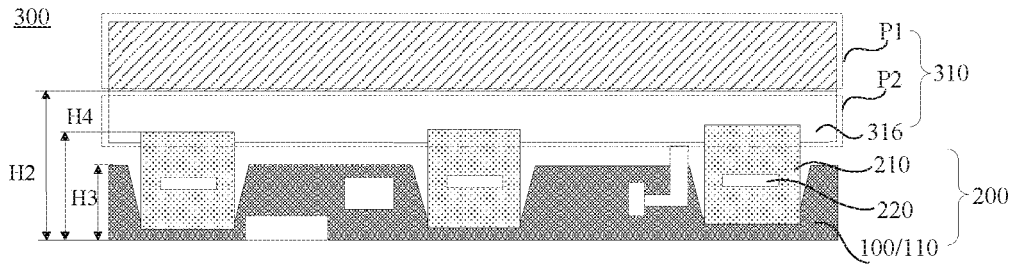
FIG. 2G is a structural diagram of a display module, in accordance with some other embodiments.

FIG. 2E is a relationship diagram of projection positions, in accordance with some embodiments. FIG. 2F is a relationship diagram of projection positions, in accordance with some other embodiments. FIG. 2G is a structural diagram of a display module, in accordance with some other embodiments.

As shown in FIG. 2B, the driving chip 220 is installed on the flexible printed circuit 210, and is located on a side of the flexible printed circuit 210 proximate to the driving circuit board 100.

As shown in FIGS. 2E and 2F, an orthographic projection Q2 of the driving chip 220 on a first reference plane is located inside an orthographic projection Q1 of the opening 121 on the first reference plane. The first reference plane is a plane parallel to the first main surface 111.

It will be understood that the first reference plane is a virtual plane (as indicated by the virtual plane N in FIG. 2E or 2F) parallel to or approximately parallel to the first main surface 111.

It can be seen from the above that, as shown in FIG. 2B, the bonding component 130 is located on the first main surface 111, and the opening 121 of the receiving structure 120 is closer to the first edge L1 than the bonding component 130. Therefore, in a case where the end of the flexible printed circuit 210 is bonded to the bonding component 130, and the another end of the flexible printed circuit 210 is bonded to the bonding side of the display panel 310, as shown in FIGS. 2E and 2F, an orthographic projection Q3 of the flexible printed circuit 210 on the first reference plane is able to be at least partially overlapped with the orthographic projection Q1 of the opening 121 on the first reference plane.

Since the driving chip 220 is installed on the flexible printed circuit 210, and is located on the side of the flexible printed circuit 210 proximate to the driving circuit board 100, the orthographic projection Q2 of the driving chip 220 on the first reference plane is able to be located inside the orthographic projection Q1 of the opening 121 on the first reference plane.

It will be understood that the orthographic projection Q2 of the driving chip 220 on the first reference plane is located inside the orthographic projection Q1 of the opening 121 on the first reference plane, which means that the orthographic projection Q2 of the driving chip 220 on the first reference plane is able to be located in a region enclosed by orthographic projections of edges of the opening 121 on the first reference plane.

In some examples, as shown in FIG. 2E, the orthographic projections of the edges of the opening 121 on the first reference plane form a closed shape by enclosing, such as a trapezoidal shape, a circular shape, a rectangular shape, or other irregular shape. The orthographic projection Q2 of the driving chip 220 on the first reference plane is located inside the orthographic projection Q1 of the opening 121 on the first reference plane, which means that the orthographic projection Q2 of the driving chip 220 on the first reference plane falls into the closed shape formed by the orthographic projections of the edges of the opening 121 on the first reference plane by enclosing.

In some other examples, as shown in FIG. 2F, the orthographic projections of the edges of the opening 121 on the first reference plane are in a non-closed shape, and are able to define a concave cavity. The orthographic projection Q2 of the driving chip 220 on the first reference plane is located inside the orthographic projection Q1 of the opening 121 on the first reference plane, which means that the orthographic projection Q2 of the driving chip 220 on the first reference plane falls into the concave cavity defined by the orthographic projections of the edges of the opening 121 on the first reference plane.

It will be understood that the driving chip 220 is installed on the flexible printed circuit 210 and is located on the side of the flexible printed circuit 210 proximate to the driving circuit board 100, and the orthographic projection Q2 of the driving chip 220 on the first reference plane is located inside the orthographic projection Q1 of the opening 121 on the first reference plane, so that the circuit board body 110 is capable of avoiding the driving chip 220.

It will be understood that the first edge L1 is closer to the bonding side of the display panel 310 than the second edge L2, and the opening 121 of the receiving structure 120 is closer to the first edge L1 than the bonding component 130, so that the orthographic projection of the opening 121 on the first reference plane is able to be located between an orthographic projection of the display panel 310 on the first reference plane and an orthographic projection of the bonding component 130 on the first reference plane.

In some examples, the driving chip 220 is able to pass through the opening 121 in the first main surface 111 and be located in the receiving structure 120, so that the circuit board body 110 is capable of avoiding the driving chip 220 through the receiving structure 120.

In some other examples, the driving chip 220 is spaced apart from the first main surface 111, and does not pass through the opening 121. That is, the driving chip 220 is able to be located between the flexible printed circuit 210 and the driving circuit board 100, so that the circuit board body 110 is also capable of avoiding the driving chip 220 through the receiving structure 120.

That is, the receiving structure 120 is disposed in the circuit board body 110, and the orthographic projection Q2 of the driving chip 220 on the first reference plane is located inside the orthographic projection Q1 of the opening 121 of the receiving structure 120 on the first reference plane, so that the circuit board body 110 is capable of avoiding the driving chip 220 through the receiving structure 120, thereby reducing crosstalk generated between the circuit board body 110 and the driving chip 220.

In this way, as shown in FIG. 2B, an additional longitudinal space (i.e., an additional space in a direction from the display panel 310 to the driving circuit board 100) is not required to be provided to receive the driving chip(s) 220. That is, by using the method of disposing the receiving structure 120 in the circuit board body 110 to avoid the driving chip 220, a width H4 of the circuit board assembly 200 is able to be reduced to reduce a width H2 of a side bezel of the display module 300, thereby realizing a narrow bezel of the display module 300 to improve the visual effect of the display module 300.

For example, as shown in FIG. 2G, in the embodiments of the present disclosure, the width H2 of the side bezel of the display module 300 is 24.4 mm. The width H3 of the circuit board body 110 is 13.5 mm. Thus, it can be seen that compared with FIG. 1D, even if the width H3 of the circuit board body 110 is increased (from 13 mm to 13.5 mm), the width H2 of the side bezel of the display module 300 is still able to be reduced (from 30.6 mm to 24.4 mm), thereby realizing the narrow bezel of the display module 300 to improve the visual effect of the display module 300.

It will be noted that the width H3 of the circuit board body 110 in FIG. 2G is greater than the width H3 of the circuit board body 110 in FIG. 1D, which only illustrates that even if the width H3 of the circuit board body 110 is increased, the width H2 of the side bezel of the display module 300 is still able to be reduced by disposing the receiving structure 120 in the circuit board body 110. The width H3 of the circuit board body 110 in the embodiments of the present disclosure is not further limited.

In some examples, as shown in FIG. 2B, the side of the flexible printed circuit 210 proximate to the first main surface 111 is bonded to a lower edge of the display panel 310. That is, the side of the flexible printed circuit 210 on which the driving chip 220 is installed is bonded to the bonding side of the display panel 310.

In such arrangement, the driving chip 220 is prevented from protruding from the display panel 310 in a thickness direction of the display panel 310, so that the driving chip 220 is able to be protected, thereby improving an operational reliability of the circuit board assembly 200.

It can be seen from the above that, as shown in FIG. 2A, in the embodiments of the present disclosure, the driving circuit board 100 is arranged adjacent to the peripheral region P2 of the display panel 310, the end of the flexible printed circuit 210 is bonded to the bonding component 130 of the driving circuit board 100, and the another end of the flexible printed circuit 210 is bonded to the bonding side of the display panel 310, so that the flexible printed circuit 210 and the driving circuit board 100 do not need to occupy a space in the thickness direction of the display panel 310, which is conducive to thinning the display panel 310.

The driving chip 220 is installed on the flexible printed circuit 210, and is located on the side of the flexible printed circuit 210 proximate to the driving circuit board 100, so that the driving chip 220 is prevented from being disposed in the peripheral region P2, thereby reducing the width of the peripheral region P2 of the display panel 310. That is, the width of the side bezel of the display panel 310 is able to be reduced.

In addition, as shown in FIG. 2B, the circuit board body 110 is provided with the receiving structure(s) 120. As shown in FIGS. 2E and 2F, the orthographic projection Q2 of the driving chip 220 on the first reference plane is located inside the orthographic projection Q1 of the opening 121 of the receiving structure 120 on the first reference plane, so that the circuit board body 110 is able to avoid the driving chip 220 through the receiving structure 120, thereby reducing the crosstalk generated between the circuit board body 110 and the driving chip 220.

In this way, the additional longitudinal space (i.e., additional space in the direction from the display panel 310 to the driving circuit board 100) is not required to be disposed to receive the driving chip 220. That is, That is, by using the method of disposing the receiving structure 120 in the circuit board body 110 to avoid the driving chip 220, the width H4 of the circuit board assembly 200 is able to be reduced to reduce the width H2 of the side bezel of the display module 300, thereby realizing the narrow bezel of the display module 300 to improve the visual effect of the display module 300.

In some embodiments, as shown in FIG. 2B, the driving chip 220 passes through the opening 121, and is at least partially located in the receiving structure 120.

It can be seen from the above that, as shown in FIGS. 2E and 2F, the orthographic projection Q2 of the driving chip 220 on the first reference plane is located inside the orthographic projection Q1 of the opening 121 on the first reference plane, and the driving chip 220 is installed on the flexible printed circuit 210 and is located on the side of the flexible printed circuit 210 proximate to the driving circuit board 100, so that the driving chip 220 is able to pass through the opening 121, and is at least partially located in the receiving structure 120.

In some examples, as shown in FIG. 2C, in a case where the receiving structure 120 has the opening 121 in the first main surface 111 and the opening 121 in the second main surface 112, the driving chip 220 may pass through the opening 121 in the first main surface 111, and is located in the receiving structure 120. The driving chip 220 may also pass through the opening 121 in the first main surface 111 and the opening 121 in the second main surface 112, and is partially located in the receiving structure 120.

In some other examples, as shown in FIG. 2D, in a case where the receiving structure 120 has the opening 121 in the first main surface 111, and does not have the opening 121 in the second main surface 112, the driving chip 220 passes through the opening 121 in the first main surface 111, and is at least partially located in the receiving structure 120.

In this arrangement, the circuit board body 110 is able to protect the driving chip 220 to prolong the service life of the driving chip 220, so as to improve the reliability of the display module 300.

In some embodiments, as shown in FIG. 2C, the receiving structure 120 penetrates the circuit board body 100 in the direction from the first main surface 111 to the second main surface 112. As shown in FIG. 2C, the receiving structure 120 penetrates the circuit board body 100 in the direction from the first main surface 111 to the second main surface 112, so that the receiving structure 120 is able to have the opening 121 in the first main surface 111 and the opening 121 in the second main surface 112.

The receiving structure 120 is arranged to penetrate the circuit board body 100 in the direction from the first main surface 111 to the second main surface 112. In this way, even if a thickness of the driving chip 220 is greater than the thickness M2 of the circuit board body 110, the driving chip 220 is able to pass through the opening 121 in the first main surface 111 and the opening 121 in the second main surface 112, and is partially located in the receiving structure 120.

That is, in the above arrangements, the receiving structure 120 is able to receive the driving chips 220 with different thicknesses, so that an applicability of the circuit board body 110 is improved. Moreover, the receiving structure 120 is arranged to penetrate the first main surface 111 and the second main surface 112, so that a manufacturing process of the circuit board body 110 is able to be simplified, thereby improving a production efficiency of the driving circuit board 100 and reducing a production cost of the driving circuit board 100.

In some embodiments, as shown in FIGS. 2B and 2E, a distance d1 between the opening 121 and the first edge L1 is less than a distance d2 between the opening 121 and the second edge L2.

It can be seen from the above that, the opening 121 is closer to the first edge L1 than the bonding component 130, and the two ends of the flexible printed circuit 210 are respectively bonded to the bonding component 130 and the bonding side of the display panel 310. Therefore, the distance between the opening 121 and the first edge L1 is set be less than the distance between the opening 121 and the second edge L2, so that the opening 121 is able to be close to the display panel 310. Thus, a length of the flexible printed circuit 210 in the direction from the display panel 310 to the driving circuit board 100 is able to be reduced, so as to reduce the cost of the flexible printed circuit 210.

In addition, as shown in FIG. 2G, the length of the flexible printed circuit 210 is reduced, so that an overlapping area of the flexible printed circuit 210 and the circuit board body 110 is able to be further reduced, which is conducive to an arrangement of components on the circuit board body 110. Thus, the width H3 of the circuit board body 110 is able to be further reduced. That is, the width H4 of the circuit board assembly 200 is able to be reduced, so that the width H2 of the side bezel of the display module 300 is reduced, thereby realizing the narrow bezel of the display module 300 to improve the visual effect of the display module 300.

In some examples, an edge of the opening 121 is connected to the first edge L1. That is, the distance between the opening 121 and the first edge L1 is able to be 0. As shown in FIG. 2B, this arrangement enables the opening 121 to be an open opening, and the open side faces the display panel 310, so that the convenience of placing the driving chip 220 in the receiving structure 210 is improved.

Figure 3A:
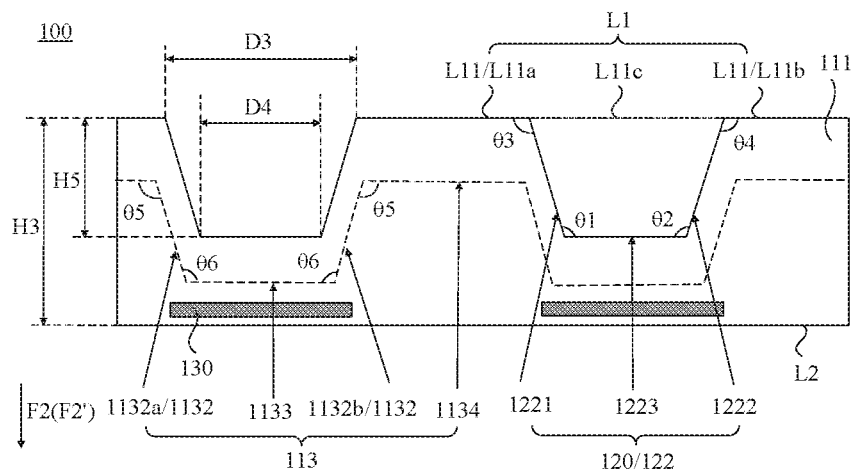
FIG. 3A is a structural diagram of a driving circuit board, in accordance with some embodiments.

FIG. 3A is a structural diagram of a driving circuit board, in accordance with some embodiments.

In some embodiments, as shown in FIG. 3A, the first edge L1 includes a plurality of sub-edges L11 that are spaced apart from each other. The receiving structure 120 includes a sidewall surface 122 connected between two adjacent sub-edges L11. At least a portion of the sidewall surface 122 extends in a direction F2 towards the second edge L2.

In some examples, the first edge L1 includes an edge of the first main surface 111 proximate to the bonding side of the display panel 310. The sidewall surface 122 is connected between the two adjacent sub-edges L11, so that the receiving structure 120 is able to have the opening 121 in the first main surface 111.

In some other examples, the first edge L1 further includes an edge of the second main surface 112 proximate to the bonding side of the display panel 310 in addition to the edge of the first main surface 111 proximate to the bonding side of the display panel 310. The sidewall surface 122 is connected between the two adjacent sub-edges L11, so that the receiving structure 120 is able to penetrate the first main surface 111 and the second main surface 112. That is, the receiving structure 120 is able to have the opening 121 in the first main surface 111 and the opening 121 in the second main surface 112.

In some examples, lengths of the plurality of sub-edges L11 in the first edge L1 may be the same or different. Distances between the plurality of sub-edges L11 may be the same or different.

In some examples, any of the plurality of sub-edges L11 is parallel to or approximately parallel to the second edge L2.

It will be understood that the sidewall surface 122 of the receiving structure 120 is connected between the two adjacent sub-edges L11, so that the distance between the opening 121 and the first edge L1 is able to be approximately zero, thereby enabling the opening 121 to be the open opening with the open side facing the display panel 310, so as to improve the convenience of placing the driving chip 220 in the receiving structure 120.

The at least a portion of the sidewall surface 122 extends in the direction towards the second edge L2. In some examples, the sidewall surface 122 may extend in the direction towards the second edge L2 and in a direction perpendicular or approximately perpendicular to the second edge L2. In some other examples, the sidewall surface 122 may extend in the direction towards the second edge L2 and in an inclined direction with respect to the second edge L2.

It will be understood that the sidewall surface 122 may also extend in the direction from the first main surface 111 to the second main surface 112. In some examples, the sidewall surface 122 is perpendicular to the first main surface 111 and the second main surface 112.

In some examples, in a case where the receiving structure 120 penetrates the circuit board body 110 in the direction from the first main surface 111 to the second main surface 112, the sidewall surface 122 is able to be connected to the first main surface 111 and the second main surface 112 in the direction from the first main surface 111 to the second main surface 112.

It will be understood that in a case where the driving chip 220 is located in the receiving structure 120, the driving chip 220 is located on a side of the sidewall surface 122 away from the circuit board body 110.

As shown in FIG. 3A, the sidewall surface 122 is connected between the two adjacent sub-edges L11, and the at least a portion of the sidewall surface 122 extends in the direction towards the second edge L2. This arrangement enables the driving chip 220 to be located in the receiving structure 120 through an interval between the two adjacent sub-edges L11 (i.e., the open side of the opening 121), which improves the convenience of placing the driving chip 220 in the receiving structure 120, thereby improving the convenience of installing the circuit board assembly 200, so as to improve the production efficiency of the display module 300 and reduce the production cost.

Figure 3B:
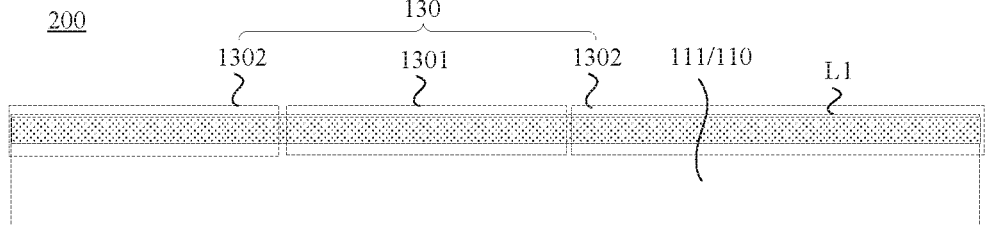
FIG. 3B is a structural diagram of a driving circuit board.
Figure 3C:
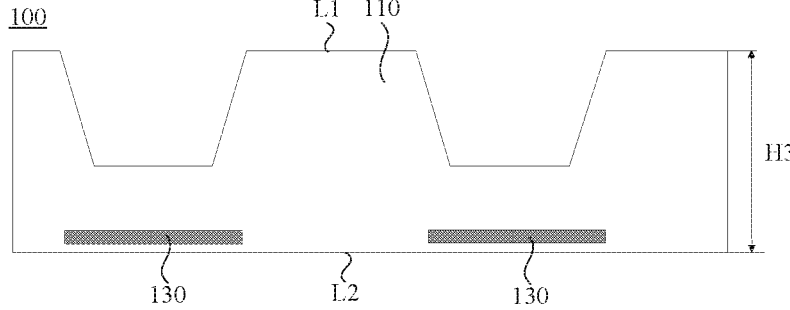
FIG. 3C is a structural diagram of a driving circuit board, in accordance with some other embodiments.

FIG. 3B is a structural diagram of a driving circuit board. FIG. 3C is a structural diagram of a driving circuit board, in accordance with some other embodiments.

As shown in FIG. 3B, in some implementations, the bonding component 130 is arranged next to the first edge L1, and a length of the bonding component 130 in an extending direction of the first edge L1 is the same or approximately the same as a length of the first edge L1.

For example, as shown in FIG. 3B, the bonding component 130 has bonding regions 1301 and a non-bonding region 1302. An end of the flexible printed circuit 210 is bonded to a portion of the bonding component 130 in the bonding region 1301. When the flexible printed circuits 210 are bonded to the bonding component 130, the plurality of flexible printed circuits 210 are bonded to respective portions of the bonding component 130 in the plurality of bonding regions 1301 by using a whole cutter head. A portion of the bonding component 130 in the non-bonding region 1302 functions to dissipate heat, thereby protecting the circuit board body 110.

This arrangement enables the bonding connection efficiency of the flexible printed circuit 210 and the bonding component 130 to be improved, thereby improving the production efficiency of the circuit board assembly 200.

It will be noted that, in FIG. 3B, edges of a dashed box are separated from edges of the bonding component 130, which is only for illustrating the bonding regions 1301 and the non-bonding region 1302, and the bonding component 130 is not further limited.

However, it is found that, in the above implementations, the portion of the bonding component 130 in the non-bonding region 1302 occupies an area of the first main surface 111, so that an area utilization rate of the first main surface 111 is reduced. That is, an area utilization rate of the circuit board body 110 is reduced.

In order to improve the area utilization rate of the circuit board body 110, as shown in FIG. 3C, in some examples, there are a plurality of bonding components 130, and the plurality of the bonding components 130 are spaced apart from each other.

It will be understood that the number of the flexible printed circuits 210 is the same as the number of the bonding components 130, and a flexible printed circuit 210 is electrically connected to a bonding component 130. For example, the number of the bonding components 130 is 3, and the number of the flexible printed circuits 210 is also 3.

It will be understood that, the plurality of bonding components 130 are spaced apart from each other, so that two adjacent bonding components 130 are able to be provided with a component or a conductive wiring therebetween, which improves the area utilization rate of the first main surface 111, i.e., improves the area utilization rate of the circuit board body 110. Thus, the width H3 of the circuit board body 110 is able to be reduced. That is, the width H2 of the side bezel of the display module 300 is able to be reduced, thereby realizing the narrow bezel of the display module 300.

For example, when the flexible printed circuit 210 is bonded to the bonding component 130, a plurality of flexible printed circuits 210 are respectively bonded to the plurality of bonding components 130 that are spaced apart from each other by using a plurality of small cutter heads, so that the bonding connection efficiency of the flexible printed circuits 210 and the bonding components 130 is improved, thereby improving the production efficiency of the circuit board assembly 200 without damaging the circuit board body 110.

In some examples, as shown in FIG. 3C, the plurality of bonding components 130 are located on a side of the circuit board body 110 proximate to the second edge L2, so that the end of the flexible printed circuit 210 is able to be bonded to the side of the circuit board body 110 proximate to the second edge L2.

In this arrangement, as shown in FIG. 2G, in a case where a length of flexible printed circuit 210 is fixed, the width H4 of circuit board assembly 200 is able to be further reduced, so that the width H2 of the side bezel of the display module 300 is reduced, thereby realizing the narrow bezel of the display module 300 to improve the visual effect of the display module 300.

In some embodiments, as shown in FIG. 3A, the two adjacent sub-edges L11 include a first sub-edge L11a and a second sub-edge L11b. The sidewall surface 122 includes a first wall surface 1221, a second wall surface 1222 and a third wall surface 1223. An end of the first wall surface 1221 is connected to an end of the first sub-edge L11a proximate to the second sub-edge L11b, and another end of the first wall surface 1221 extends in the direction towards the second edge L2. An end of the second wall surface 1222 is connected to an end of the second sub-edge L11b proximate to the first sub-edge L11a, and another end of the second wall surface 1222 extends in the direction towards the second edge L2. An end of the third wall surface 1223 is connected to an end of the first wall surface 1221 away from the first sub-edge L11a, and another end of the third wall surface 1223 is connected to an end of the second wall surface 1222 away from the second sub-edge L11b.

It will be noted that, in the embodiments of the present disclosure, the first sub-edge L11a and the second sub-edge L11b are only used for distinguishing the two adjacent sub-edges L11, and the structure of the sub-edge L11 is not further limited.

The end of the first wall surface 1221 is connected to the end of the first sub-edge L11a proximate to the second sub-edge L11b, and the end of the second wall surface 1222 is connected to the end of the second sub-edge L11b proximate to the first sub-edge L11a, so that the sidewall surface 122 is able to be connected between the two adjacent sub-edges L11.

Moreover, the end of the first wall surface 1221 away from the first sub-edge L11a extends in the direction towards the second edge L2, the end of the second wall surface 1222 away from the second sub-edge L11b extends in the direction towards the second edge L2, and the two ends of the third wall surface 1223 are respectively connected to the end of the first wall surface 1221 away from the first sub-edge L11a and the end of the second wall surface 1222 away from the second sub-edge L11b, so that the first wall surface 1221, the second wall surface 1222 and the third wall surface 1223 are able to form the receiving structure 120 by enclosing.

In some examples, the third wall surface 1223, the plurality of sub-edges L11, and the second edge L2 are parallel to each other or approximately parallel to each other.

In some examples, as shown in FIG. 3A, the width H3 of the circuit board body 110 is 13.5 mm, and a distance H5 between the third wall surface 1223 and the first edge L1 is 5 mm.

This arrangement enables a structural regularity of the sidewall surface 122 to be improved, thereby improving a processing convenience of the driving circuit board 100.

In some examples, as shown in FIG. 3A, a distance D3 between the first sub-edge L11a and the second sub-edge L11b is greater than a length D4 of the third wall surface 1223 in an extending direction F3' of the second edge L2.

It will be understood that the distance D3 between the first sub-edge L11a and the second sub-edge L11b is greater than the length D4 of the third wall surface 1223 in the extending direction of the second edge L2, so that the driving chip 220 is more easily disposed in the receiving structure 120 through the interval between the two adjacent sub-edges L11

(i.e., the interval between the first sub-edge L11a and the second sub-edge L11b), thereby further improving the processing convenience of the circuit board assembly 200 and improving the production efficiency of the circuit board assembly 200.

In some embodiments, as shown in FIG. 3A, a distance between the first wall surface 1221 and the second wall surface 1222 is gradually reduced in a direction F2' from the first edge L1 to the second edge L2.

It will be understood that, as shown in FIG. 3A, the distance between the first wall surface 1221 and the second wall surface 1222 is gradually reduced in the direction from the first edge L1 to the second edge L2, which means that the first wall surface 1221 and the second wall surface 1222 extend in the direction towards the second edge L2 and in the inclined direction with respect to the second edge L2.

In this way, as shown in FIG. 3A, on one hand, the distance D3 between the first sub-edge L11a and the second sub-edge L11b is able to be greater than the length D4 of the third wall surface 1223 in the extending direction of the second edge L2, so that the driving chip 220 is more easily disposed in the receiving structure 120 through the interval between the two adjacent sub-edges L11 (i.e., the interval between the first sub-edge L11a and the second sub-edge L11b), thereby improving the processing convenience of the circuit board assembly 200 and improving the production efficiency of the circuit board assembly 200.

On another hand, the distance between the first wall surface 1221 and the second wall surface 1222 is gradually reduced in the direction from the first edge L1 to the second edge L2, so that the structural regularity of the receiving structure 120 is able to be improved, thereby improving the processing convenience of the driving circuit board 100 to reduce the production cost of the driving circuit board 100.

It will be understood that, as shown in FIG. 2B, the length D4 of the third wall surface 1223 in the extending direction of the second edge L2 is greater than the width D2 of the driving chip 220, so that the driving chip 220 is able to be located in the receiving structure 120.

For example, the width D2 of the driving chip 220 is 19.5 mm, and the length D4 of the third wall surface 1223 in the extending direction of the second edge L2 is 25 mm, which improves the convenience of disposing the driving chip 220 in the receiving structure 120. That is, the convenience of installing the circuit board assembly 200 is improved.

Figure 3D:
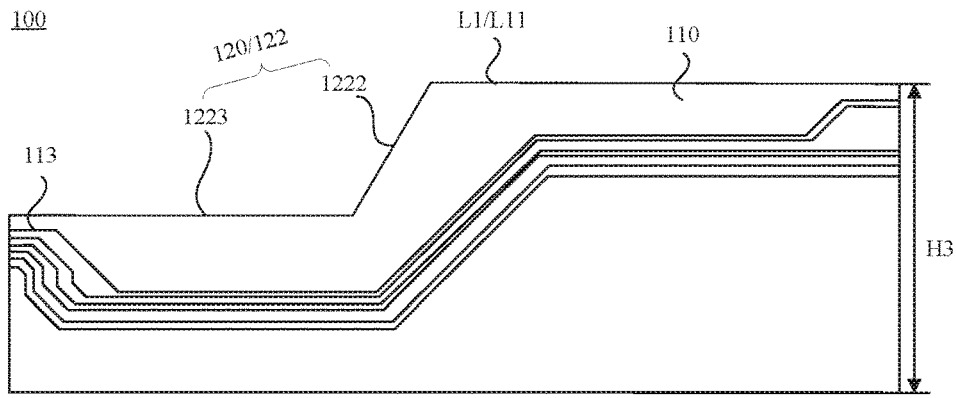
FIG. 3D is a structural diagram of a driving circuit board, in accordance with yet other embodiments.

FIG. 3D is a structural diagram of a driving circuit board, in accordance with yet other embodiments.

In some embodiments, as shown in FIG. 3D, the circuit board body 110 further includes a plurality of signal wirings 113.

It will be understood that the signal wiring 113 is used for transmitting a signal. In some examples, the plurality of signal wirings 113 are arranged in the plurality of conductive layers 116. That is, a conductive layer 116 is provided with some (two or more) of the plurality of signal wirings 113. It will be understood that orthographic projections of signal wirings 113 located in different conductive layers 116 on the first reference plane may be overlapped with each other. In some other examples, the plurality of signal wirings 113 are arranged in the same conductive layer 116.

In some examples, in a case where a conductive layer 116 is provided with signal wirings 113, the signal wirings 113 are arranged in sequence in a direction away from the sidewall surface 122.

In some examples, as shown in FIG. 3D, at least a portion of each of at least one signal wiring 113 extends in an extending direction of an orthographic projection of the sidewall surface 122 on the first reference plane. That is, an extending direction of the at least a portion of each of the at least one signal wiring 113 is the same as or approximately the same as the extending direction of the orthographic projection of the sidewall surface 122 on the first reference plane.

In some examples, at least a portion of each of the plurality of signal wirings 113 extends in the extending direction of the orthographic projection of the sidewall surface 122 on the first reference plane.

It can be seem from the above that, as shown in FIG. 3A, the sidewall surface 122 includes the first wall surface 1221, the second wall surface 1222 and the third wall surface 1223. In some embodiments, each of the at least one signal wiring 113 includes first portion signal wirings 1134, second portion signal wirings 1132 and third portion signal wiring(s) 1133.

An extending direction of the first portion signal wiring 1134 is the same as an extending direction of an orthographic projection of the first edge L1 on the first reference plane. The second portion signal wiring 1132 has a first second portion signal wiring connection end and a second second portion signal wiring connection end, and the first second portion signal wiring connection end is electrically connected to the first portion signal wiring 1134. It will be understood that the first second portion signal wiring connection end is electrically connected to an end of the first portion signal wiring 1134.

The third portion signal wiring 1133 is electrically connected to the second second portion signal wiring connection end. That is, the third portion signal wiring 1133 is electrically connected to an end of the second portion signal wiring 1132 away from the first portion signal wiring 1134. In this way, an end of the second portion signal wiring 1132 is able to be electrically connected to the first portion signal wiring 1134, and another end of the second portion signal wiring 1132 is able to be electrically connected to the third portion signal wiring 1133. An extending direction of the third portion signal wiring 1133 is the same as an extending direction of an orthographic projection of the third wall surface 1123 on the first reference plane.

Moreover, the second portion signal wiring 1132 and the first portion signal wiring 1134 have a fifth included angle θ5 therebetween, and the fifth included angle θ5 is an obtuse angle. The second portion signal wiring 1132 and the third portion signal wiring 1133 have a sixth included angle θ6 therebetween, and the sixth included angle θ6 is an obtuse angle.

It will be understood that, as shown in FIG. 3A, the fifth included angle θ5 is an included angle located between the second portion signal wiring 1132 and the first portion signal wiring 1134. The sixth included angle θ6 is an included angle located between the second portion signal wiring 1132 and the third portion signal wiring 1133.

It will be noted that the extending direction of the first portion signal wiring 1134 may be the same as or approximately the same as the extending direction of the orthographic projection of the first edge L1 on the first reference plane. In other words, an extending tendency of the first portion signal wiring 1134 is the same as or approximately the same as an extending tendency of the orthographic projection of the first edge L1 on the first reference plane. That is, an orthographic projection of the first portion signal wiring 1134 on the first reference plane and the orthographic projection of the first edge L1 on the first reference plane may be parallel to each other, or may have a certain included angle (e.g., an included angle within 5°) therebetween.

Similarly, the extending direction of the third portion signal wiring 1133 may be the same as or approximately the same as the extending direction of the orthographic projection of the third wall surface 1223 on the first reference plane. In other words, an extending tendency of the third portion signal wiring 1133 is the same as or approximately the same as an extending tendency of the orthographic projection of the third wall surface 1223 on the first reference plane. That is, the orthographic projection of the third portion signal wiring 1133 on the first reference plane and the orthographic projection of the third wall surface 1223 on the first reference plane may be parallel to each other, or may have a certain included angle (e.g., an included angle within 5°) therebetween.

In some examples, the extending direction of the first portion signal wiring 1134 is the same as or approximately the same as an extending direction of an orthographic projection of a sub-edge L11 on the first reference plane. For example, in a case where extending directions of the plurality of sub-edges L11 are the same, the extending direction of the first portion signal wiring 1134 is the same as or approximately the same as an extending direction of an orthographic projection of any sub-edge L11 on the first reference plane.

It will be understood that the end of the second portion signal wiring 1132 is electrically connected to the first portion signal wiring 1134, and the another end of the second portion signal wiring 1132 is electrically connected to the third portion signal wiring 1133. Moreover, the second portion signal wiring 1132 and the first portion signal wiring 1134 have the fifth included angle θ5 therebetween, and the fifth included angle θ5 is the obtuse angle. The second portion signal wiring 1132 and the third portion signal wiring 1133 have the sixth included angle θ6 therebetween, and the sixth included angle θ6 is the obtuse angle.

In this way, the extending direction of each of the at least one signal wiring 113 is able to be changed to realize signal transmission. For example, as shown in FIG. 3A, the first portion signal wirings 1134 are disposed respectively on two sides of the open receiving structure 120, the third portion signal wiring 1133 is disposed between the receiving structure 120 and the second edge L2, and two ends of the second portion signal wiring 1132 are respectively electrically connected to the first portion signal wiring 1134 and the third portion signal wiring 1133, so that the extending direction of each of the at least one signal wiring 113 is able to be changed, and thus the at least one signal wiring 113 bypasses the receiving structure 120 to realize the signal transmission.

In this way, the area utilization rate of the circuit board body 110 is improved. On one hand, the width H3 of the circuit board body 110 is able to be reduced, so that the width H2 of the side bezel of the display module 300 is able to be reduced, thereby realizing the narrow bezel of the display module 300 to improve the visual effect of the display module 300. On another hand, the area utilization rate of the circuit board body 110 is improved, so that the material consumption of the circuit board body 110 is able to be reduced, thereby reducing the cost of the circuit board body 110.

Moreover, when the extending direction(s) of the at least one signal wiring 113 is changed, an included angle between wirings is able to be an obtuse angle, so that a parasitic capacitance and a parasitic inductance generated when the extending direction(s) of the at least one signal wiring 113 are changed are reduced, so as to improve the transmission reliability of the signal, thereby improving an operational reliability of the driving circuit board 100.

It will be understood that in a case where the first edge L1 is parallel to or approximately parallel to the third wall surface 1223, the fifth included angle θ5 and the sixth included angle θ6 are the same or approximately the same.

In some examples, as shown in FIG. 3A, an extending direction of the second portion signal wiring 1132 is the same as an extending direction of an orthographic projection of the first wall surface 1221 or the second wall surface 1222 on the first reference plane.

It will be noted that the extending direction of the second portion signal wiring 1132 may be the same as or approximately the same as the extending direction of the orthographic projection of the first wall surface 1221 or the second wall surface 1222 on the first reference plane. In other words, an extending tendency of the second portion signal wiring 1132 is the same as or approximately the same as an extending tendency of the orthographic projection of the first wall surface 1221 or the second wall surface 1222 on the first reference plane. That is, an orthographic projection of the second portion signal wiring 1132 on the first reference plane and the orthographic projection of the first wall surface 1221 or the second wall surface 1222 on the first reference plane may be parallel to each other, or may have a certain included angle (e.g., an included angle within 5°) therebetween.

For example, as shown in FIG. 3A, the second portion signal wirings 1132 include second portion signal wiring(s) 1132a and second portion signal wiring(s) 1132b. An extending direction of the second portion signal wiring 1132a is the same as or approximately the same as the extending direction of the orthographic projection of the first wall surface 1221 on the first reference plane. An extending direction of the second portion signal wiring 1132b is the same as or approximately the same as the extending direction of the orthographic projection of the second wall surface 1222 on the first reference plane.

It will be noted that the second portion signal wiring 1132a and the second portion signal wiring 1132b are only used for distinguishing two second portion signal wirings 1132 whose extending directions are respectively the same as or respectively approximately the same as the extending directions of the orthographic projections of the first wall surface 1221 and the second wall surface 1222 on the first reference plane, and the second portion signal wirings 1132 are not further limited.

The extending direction of the second portion signal wiring 1132 is set to be the same as or approximately the same as the extending direction of the orthographic projection of the first wall surface 1221 or the second wall surface 1222 on the first reference plane, so that the orthographic projection of the second portion signal wiring 1132 on the first reference plane is able to be matched with and close to the orthographic projection of the first wall surface 1221 or the second wall surface 1222 on the first reference plane, which reduces a distance between the second portion signal wiring 1132 and the first wall surface 1221 or between the second portion signal wiring 1132 and the second wall surface 1222, thereby improving the area utilization rate of the circuit board body 110 and reducing the width H3 of the circuit board body 110.

In some examples, an orthographic projection of the at least a portion of each of the at least one signal wiring 113 (including the first portion signal wirings 1134, the second portion signal wirings 1132 and the third portion signal wiring 1133) on the first reference plane is matched with and close to the orthographic projections of the first edge L1 and the sidewall surface 122 (including the first wall surface

1221, the second wall surface 1222 and the third wall surface 1223) on the first reference plane, so that a distance of each of the at least one signal wiring 113 from the first edge L1 and the sidewall surface 122 is reduced, thereby further improving the area utilization rate of the circuit board body 110 and reducing the width H3 of the circuit board body 110.

In some embodiments, as shown in FIG. 3A, the first wall surface 1221 and the third wall surface 1223 have a first included angle θ1 therebetween, and the first included angle θ1 is an obtuse angle; the second wall surface 1222 and the third wall surface 1223 have a second included angle θ2 therebetween, and the second included angle θ2 is an obtuse angle; and/or the first wall surface 1221 and the first sub-edge L11a have a third included angle θ3 therebetween, and the third included angle θ3 is an obtuse angle; the second wall surface 1222 and the second sub-edge L11b have a fourth included angle θ4 therebetween, and the fourth included angle θ4 is an obtuse angle.

It will be understood that the first included angle θ1 and the second included angle θ2 may be the same or different. The third included angle θ3 and the fourth included angle θ4 may be the same or different.

It can be seen from the above that, the extending direction(s) of the at least one signal wiring 113 are able to be changed to bypass the receiving structure 120, so as to realize the signal transmission. Moreover, when the extending direction(s) of the at least one signal wiring 113 are changed, an included angle between wirings is an obtuse angle.

Therefore, the first included angle θ1, the second included angle θ2, the third included angle θ3, and the fourth included angle θ4 are all set to be the obtuse angles, so that the orthographic projection of the at least a portion of each of the at least one signal wiring 113 (including the first portion signal wirings 1134, the second portion signal wirings 1132 and the third portion signal wiring 1133) on the first reference plane is matched with and close to the orthographic projections of the first edge L1 and the sidewall surface 122 (including the first wall surface 1221, the second wall surface 1222 and the third wall surface 1223) on the first reference plane, which reduces a distance of each of the at least one signal wiring 113 from the first edge L1 and the sidewall surface 122, thereby further improving the area utilization rate of the circuit board body 110 and reducing the width H3 of the circuit board body 110.

That is, the first included angle θ1, the second included angle θ2, the third included angle θ3 and the fourth included angle θ4 are set to be obtuse angles, so that when the extending direction(s) of the at least one signal wiring 113 are changed, each of the at least one signal wiring 113 extends along the edge of the opening 121, and thus the included angle between the wirings is the obtuse angle. On one hand, the area utilization rate of the circuit board body 110 is improved, and on another hand, the convenience of wiring is further able to be improved, thereby improving the processing convenience of the circuit board body 110.

It will be understood that in a case where any sub-edge L11, the second edge L2 and the third wall surface 1223 are parallel to each other or approximately parallel to each other, the third included angle θ3 is the same or approximately the same as the first included angle θ1, and the fourth included angle θ4 is the same or approximately the same as the second included angle θ2.

In some examples, as shown in FIG. 3A, orthographic projections of edges of the sidewall face 122 on the first reference face and a virtual connection line L11c connecting the two adjacent sub-edges L11 are able to form a trapezoid by enclosing. It will be understood that the virtual connection line L11c is an auxiliary line added for describing the receiving structure.

For example, the orthographic projection of the third wall surface 1223 on the first reference plane is an upper bottom of the trapezoid, the orthographic projections of the first wall surface 1221 and the second wall surface 1222 on the first reference plane are waists of the trapezoid, and the virtual connection line L11c is a lower bottom of the trapezoid. It will be understood that the upper bottom of the trapezoid is parallel to the lower bottom of the trapezoid, and a length of the upper bottom is less than a length of the lower bottom.

Figure 3E:
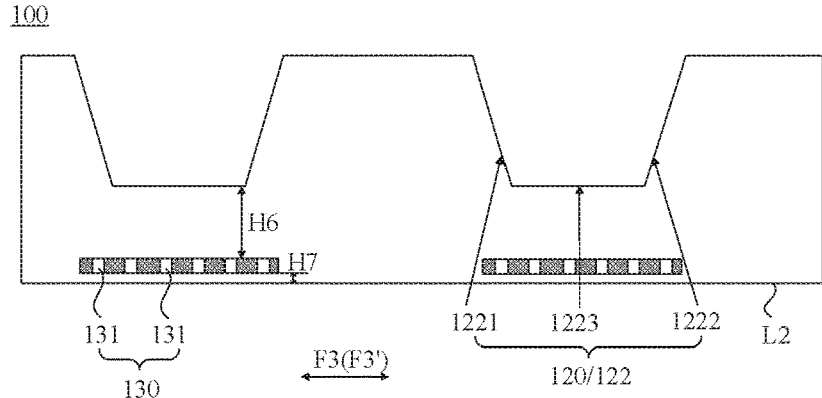
FIG. 3E is a structural diagram of a driving circuit board, in accordance with yet other embodiments.
Figure 3F:
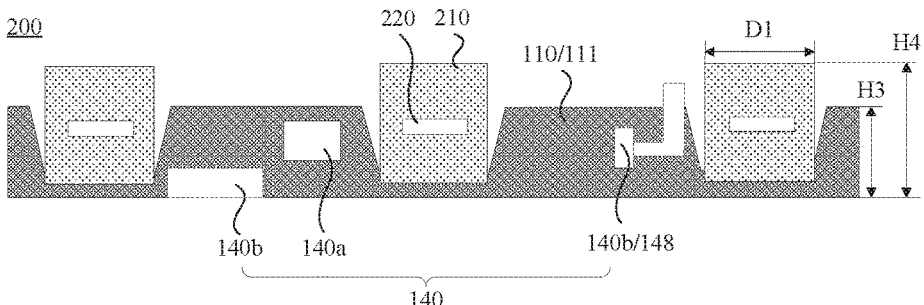
FIG. 3F is a structural diagram of a circuit board assembly, in accordance with some other embodiments.

FIG. 3E is a structural diagram of a driving circuit board, in accordance with yet other embodiments. FIG. 3F is a structural diagram of a circuit board assembly, in accordance with some other embodiments.

In some embodiments, as shown in FIG. 3E, the bonding component 130 includes a plurality of connection pins 131, and the plurality of connection pins 131 are sequentially arranged at intervals in a direction F3 parallel to the second edge L2. At least some of the connection pins 131 are located between the third wall surface 1223 and the second edge L2. In the extending direction of the second edge L2, the bonding component 130 extends beyond at least one end of the third wall surface 1223.

It will be understood that the intervals between the plurality of connection pins 131 may be the same or different. The plurality of connection pins 131 are sequentially arranged at intervals in a direction parallel to or approximately parallel to the second edge L2.

In some examples, the plurality of connection pins 131 are located in a conductive layer 116, and exposed from the first main surface 111. The end of the flexible printed circuit 210 is bonded to the bonding component 130. That is, the end of the flexible printed circuit 210 is able to be bonded to the plurality of connection pins 131.

The at least some of the connection pins 131 in the bonding component 130 are located between the third wall surface 1223 and the second edge L2, so that when the flexible printed circuit 210 is bonded to the bonding component 130, the driving chip 220 installed on the flexible printed circuit 210 is more easily disposed in the receiving structure 120, thereby improving the convenience of installing the circuit board assembly 200.

Moreover, the at least some of the connection pins 131 are disposed between the third wall surface 1223 and the second edge L2, so that as shown in FIG. 3F, a smaller width D1 of the flexible printed circuit 210 enables the driving chip 220 installed on the flexible printed circuit 210 to be located in the receiving structure 120, thereby reducing the width D1 of the flexible printed circuit 210 and reducing the cost of the circuit board assembly 200.

It will be understood that, in the extending direction of the second edge L2, the bonding component 130 extends beyond the at least one end of the third wall surface 1223, which means that the at least some of the plurality of connection pins 131 in the bonding component 130 extend beyond an end of the third wall surface 1223.

In this way, the length of bonding component 130 is able to be increased, so as to improve the convenience of bonding the flexible printed circuit 210 to the bonding component 130. In addition, the stability of bonding the flexible printed circuit 210 to the bonding component 130 is further able to be improved, so as to improve the reliability of the circuit board assembly 200.

In some examples, the bonding component 130 extends beyond two ends of the third wall surface 1223 in the extending direction of the second edge L2.

In some embodiments, as shown in FIG. 3E, in the direction from the first edge L1 to the second edge L2, a distance H6 between the bonding component 130 and the third wall surface 1223 is greater than a distance H7 between the bonding component 130 and the second edge L2.

It will be understood that the distance H6 between the bonding component 130 and the third wall surface 1223 is set to be greater than the distance H7 between the bonding component 130 and the second edge L2, so that the distance H7 between the bonding component 130 and the second edge L2 is reduced, and thus the end of the flexible printed circuit 210 bonding to the bonding component 130 is able to be closer to the second edge L2.

In this way, in a case where the length of the flexible printed circuit 210 is fixed, as shown in FIG. 3F, the width H4 of the circuit board assembly 200 is able to be further reduced to reduce the width H2 of the side bezel of the display module 300, thereby realizing the narrow bezel of the display module 300 to improve the visual effect of the display module 300.

Figure 3G:
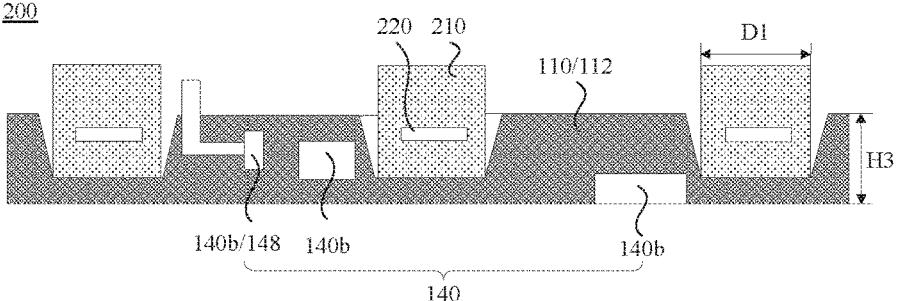
FIG. 3G is a structural diagram of a circuit board assembly, in accordance with yet other embodiments.

FIG. 3G is a structural diagram of a circuit board assembly, in accordance with yet other embodiments. The driving circuit board 100 will be continued to be exemplarily described below with reference to FIGS. 3F and 3G.

In some examples, as shown in FIG. 3F, the driving circuit board 100 further includes a plurality of electronic elements 140. The plurality of electronic elements 140 are electrically connected to the circuit board body 110. A part of the plurality of electronic elements 140 are located on the first main surface 111, and another part of the plurality of electronic elements 140 are located on the second main surface 112.

It will be understood that the plurality of electronic elements 140 are electrically connected to the signal wirings 113 on the circuit board body 110, so that the plurality of electronic elements 140 are able to be electrically connected to each other.

For example, in FIG. 3F, an electronic element 140a indicated by solid lines is located on the first main surface 111, and an electronic element 140b indicated by dashed lines is located on the second main surface 112. In FIG. 3G, an electronic element 140b indicated by solid lines is located on the second main surface 112. It will be understood that the electronic element 140a located on the first main surface 111 is not shown in FIG. 3G.

It will be noted that the electronic element 140a and the electronic element 140b are only used for distinguishing electronic elements 140 located on different main surfaces (the first main surface 111 and the second main surface 112), and the electronic elements 140 are not further limited. FIGS. 3F and 3G are only used for illustrating the electronic elements 140 located on different main surfaces (the first main surface 111 or the second main surface 112), and the arrangement position of the electronic element 140 is not further limited.

In some examples, the driving chip 220 is installed on the side of the flexible printed circuit 210 proximate to the driving circuit board 100. Thus, the driving chip 220 in FIG. 3F is indicated by dashed lines, and the driving chip 220 in FIG. 3G is shown by solid lines.

The part of the plurality of electronic elements 140 are disposed on the first main surface 111, and the another part of the plurality of electronic elements 140 are disposed on the second main surface 112, so that the area utilization rate of the circuit board body 110 is further improved, and thus the width H3 of the circuit board body 110 is able to be reduced, i.e., the width H2 of the side bezel of the display module 300 is able to be reduced, thereby realizing the narrow bezel of the display module 300 to improve the visual effect of the display module 300.

For example, the width H3 of the circuit board body 110 is able to be reduced from 29.5 mm to 13.5 mm or less through the above arrangements.

Figure 4A:
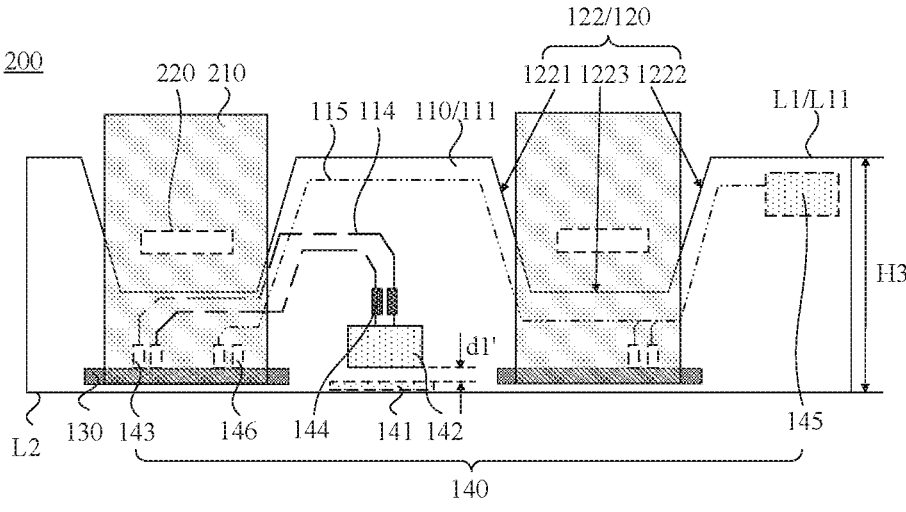
FIG. 4A is a structural diagram of a circuit board assembly, in accordance with yet other embodiments.

FIG. 4A is a structural diagram of a circuit board assembly, in accordance with yet other embodiments.

In some embodiments, as shown in FIG. 4A, the plurality of electronic elements 140 include a connector 141 and a timing controller 142. The timing controller 142 is electrically connected to the connector 141. One of the connector 141 and the timing controller 142 is located on the first main surface 111, and another one of the connector 141 and the timing controller 142 is located on the second main surface 112.

In some examples, the connector 141 and the timing controller 142 (T-Con) may be electrically connected through the plurality of signal wirings 113 in the circuit board body 110.

The connector 141 is used for receiving a control signal from the outside of the circuit board assembly 200 to transmit the control signal to the timing controller 142. It will be understood that the smaller the distance between the connector 141 and the timing controller 142, the less attenuation is generated during the signal transmission, and the higher the transmission reliability of the signal.

Therefore, the one of the connector 141 and the timing controller 142 is disposed on the first main surface 111, and the another one of the connector 141 and the timing controller 142 is disposed on the second main surface 112, so that the distance between the connector 141 and the timing controller 142 is able to be reduced. On one hand, the transmission reliability of the signal is improved, and on another hand, the width H3 of the circuit board body 110 is further able to be reduced, so that the width H2 of the side bezel of the display module 300 is reduced, thereby realizing the narrow bezel of the display module 300 to improve the visual effect of the display module 300.

For example, when the connector 141 and the timing controller 142 are disposed on the same main surface (the first main surface 111 or the second main surface 112), the distance between the connector 141 and the timing controller 142 is 20 mm. However, when the connector 141 and the timing controller 142 are disposed on different main surfaces (one of which is located on the first main surface 111 and another of which is located on the second main surface 112), the distance between the connector 141 and the timing controller 142 may be reduced to 10 mm or less.

In some examples, the connector 141 is located on the first main surface 111, and the timing controller 142 is located on the second main surface 112. In some other examples, the connector 141 is located on the second main surface 112, and the timing controller 142 is located on the first main surface 111.

In some examples, as shown in FIG. 4A, an orthographic projection of the timing controller 142 on the first reference plane has a shape of a rectangle, and long sides of the rectangle are parallel to the second edge L2, so that the area utilization rate of the circuit board body 110 is further improved, which is conducive to reducing the width H3 of the circuit board body 110.

In some embodiments, an orthographic projection of the connector 141 on the first reference plane and the ortho-graphic projection of the timing controller 142 on the first reference plane have a first distance d1' therebetween. A value of the first distance is in a range of 8 mm to 12 mm, inclusive.

In this way, the difficulty of the wiring (e.g., the first portion signal wiring 1134) between the connector 141 and the timing controller 142 is prevented from being increased due to an excessively small value (e.g., less than 8 mm) of the first distance, which improves the convenience of the wiring. On another hand, an excessively large value (e.g., greater than 10 mm) of the first distance is avoided. On one hand, the reliability of the transmission signal is able to be improved, and on another hand, the width H3 of circuit board body 110 is further able to be reduced, so that the width H2 of the side bezel of the display module 300 is reduced, thereby realizing the narrow bezel of the display module 300 to improve the visual effect of the display module 300.

In some embodiments, the value of the first distance may be in a range of 8.5 mm to 11.5 mm, 9 mm to 11 mm, or 9.5 mm to 10.5 mm. For example, the first distance may be 8.7 mm, 9.2 mm, 10 mm, 10.8 mm, or 11.5 mm.

In some embodiments, as shown in FIG. 4A, the circuit board body 110 further includes driving signal wiring(s) 114. The plurality of electronic elements 140 include first filter(s) 143 and second filter(s) 144. The first filter 143 is arranged adjacent to the bonding component 130. An input end of the first filter 143 is electrically connected to an end of the driving signal wiring 114, and an output end of the first filter 143 is electrically connected to the bonding component 130. The second filter 144 is arranged adjacent to the timing controller 142. An input end of the second filter 144 is electrically connected to the timing controller 142, and an output end of the second filter 144 is electrically connected to an end of the driving signal wiring 114 away from the first filter 143. It can be seen from the above that, the circuit board body 110 includes the plurality of signal wirings 113. In some examples, the plurality of signal wirings 113 include the driving signal wiring(s) 114. It will be understood that there may be a plurality of driving signal wirings 114.

It will be understood that during the signal transmission, a signal is easy to be distorted due to a change of an impedance on a transmission path, which affects the integrity of the signal. Therefore, the first filter 143 and the second filter 144 need to be disposed to filter the signal.

It will be understood that since the bonding component 130 is bonded to the end of the flexible printed circuit 210, and the driving chip 220 is installed on the flexible printed circuit 210, a signal output from the timing controller 142 is able to be transmitted to the driving chip 220 through the bonding component 130, thereby driving the display panel 310 to enable the display panel 310 to realize the image display function. In some examples, the timing controller 142 is used for outputting a data signal.

It will be understood that the input end of the second filter 144 is electrically connected to the timing controller 142, and the output end of the second filter 144 is electrically connected to the input end of the first filter 143 through the driving signal wiring 114. The output end of the first filter 143 is electrically connected to the bonding component 130. Thus, the signal output from the timing controller 142 is able to be filtered by the second filter 144, and then transmitted to the driving signal wiring 114, and then transmitted to the first filter 113 through the driving signal wiring 114. The signal is filtered by the first filter 143, and then transmitted to the bonding component 130.

The first filter 143 and the second filter 144 are disposed, so that a filtering effect of the signal transmitted to the bonding component 130 by the timing controller 142 is improved, and the distortion of the signal is reduced, thereby improving the integrity of the signal to improve the reliability of the driving circuit board 100. It will be understood that the smaller the distance between the first filter 143 and the bonding component 130, the less distortion of the signal when the signal is transmitted between the first filter 143 and the bonding component 130, and the higher the transmission reliability of the signal.

Therefore, the first filter 143 is arranged adjacent to the bonding component 130, so that a transmission distance between the first filter 143 and the bonding component 130 is able to be reduced, and thus a transmission path of the signal filtered by the first filter 143 is shortened, thereby reducing the distortion of the signal during transmission to improve the transmission reliability of the signal.

It will be understood that the first filter 143 and the bonding component 130 may be located on the same main surface (the first main surface 111 or the second main surface 112), or may be located on different main surfaces (the first main surface 111 or the second main surface 112). The first filter 143 is arranged adjacent to the bonding component 130. That is, an orthographic projection of the first filter 143 on the first reference plane is adjacent to an orthographic projection of the bonding component 130 on the first reference plane.

The second filter 144 is arranged adjacent to the timing controller 142, so that a distance between the second filter 144 and the timing controller 142 is able to be reduced, thereby shortening a transmission path of a signal transmitted from the timing controller 142 to the second filter 144. Thus, the signal is able to be filtered by the second filter 144 after being output from the timing controller 142, thereby reducing the distortion of the signal during transmission to improve the transmission reliability of the signal.

It will be understood that the second filter 144 and the timing controller 142 may be located on the same main surface (the first main surface 111 or the second main surface 112), or may be located on different main surfaces (the first main surface 111 or the second main surface 112). The second filter 144 is arranged adjacent to the timing controller 142. That is, an orthographic projection of the second filter 144 on the first reference plane is adjacent to an orthographic projection of the timing controller 142 on the first reference plane.

In some examples, the first filter 143 is a resistance-capacitance filter. That is, the first filter 143 includes a resistor and a capacitor, thereby functioning as a filter. The second filter 144 is a resistance-capacitance filter. That is, the second filter 144 includes a resistor and a capacitor, thereby functioning as a filter.

In some examples, there are a plurality of first filters 143, and the number of the second filters 144 is the same as the number of the first filters 143. The number of the driving signal wirings 114 is the same as the number of the first filters 143, and is the same as the number of the second filters 144. An input end of a first filter 143 is electrically coupled to an output end of a second filter 144 through a driving signal wiring 114.

It will be understood that the first filter 143 and the second filter 144 are disposed, so that the signal transmitted from the timing controller 142 to the bonding component 130 is able to be filtered. That is, the signal transmitted to the driving chip 220 is able to be filtered to reduce the distortion of the signal during transmission, so as to improve the integrity of the signal, thereby improving the transmission reliability of the signal to improve the reliability of the driving circuit board 100.

Figure 4B:
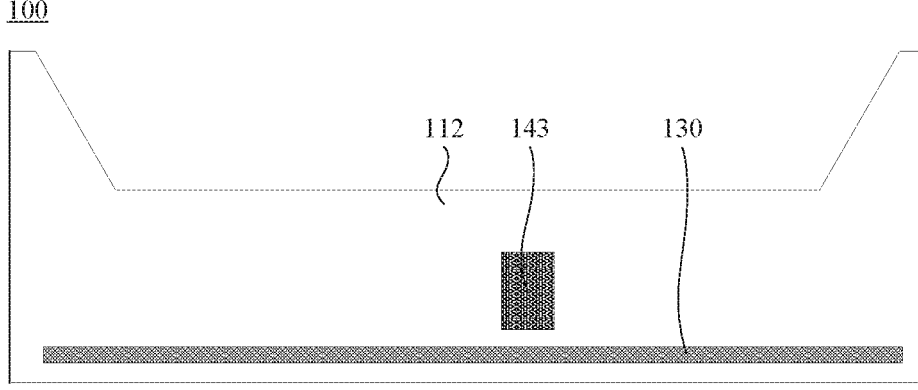
FIG. 4B is a structural diagram of a driving circuit board, in accordance with yet other embodiments.

FIG. 4B is a structural diagram of a driving circuit board, in accordance with yet other embodiments.

In some embodiments, as shown in FIG. 4B, the first filter 143 is located on a side of the bonding component 130 away from the second edge L2, and the first filter 143 is located on the second main surface 112.

It will be understood that the first filter 143 is disposed on the side of the bonding component 130 away from the second edge L2, so that the width H3 of the circuit board body 110 is able to be further reduced, thereby reducing the width H2 of the side bezel of the display module 300.

Since the bonding component 130 is located on the first main surface 111, and the first filter 143 is disposed on the second main surface 112, an interaction between the first filter 143 and the flexible printed circuit 210 is avoided when the flexible printed circuit 210 is bonded to the bonding component 130, thereby improving the reliability of the driving circuit board 100.

Figure 4C:
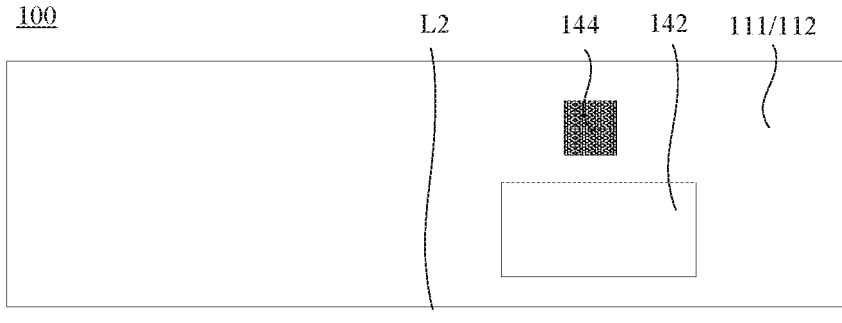
FIG. 4C is a structural diagram of a driving circuit board, in accordance with yet other embodiments.

FIG. 4C is a structural diagram of a driving circuit board, in accordance with yet other embodiments.

In some examples, the second filter 144 is located on a side of the timing controller 142 away from the second edge L2, so that the width H3 of the circuit board body 110 is able to be further reduced, thereby reducing the width H2 of the side bezel of the display module 300.

In some examples, the second filter 144 and the timing controller 142 are located on the same main surface (the first main surface 111 or the second main surface 112). For example, as shown in FIG. 4C, in a case where the timing controller 142 is located on the first main surface 111, the second filter 144 is also located on the first main surface 111. In a case where the timing controller 142 is located on the second main surface 112, the second filter 144 is also located on the second main surface 112. In this way, the convenience of electrically connecting the second filter 144 to the timing controller 142 is improved, thereby improving the production efficiency of the driving circuit board 100.

In some other examples, the second filter 144 and the timing controller 142 are located on different main surfaces (one of which is located on the first main surface 111, and another one of which is located on the second main surface 112).

Figure 4D:
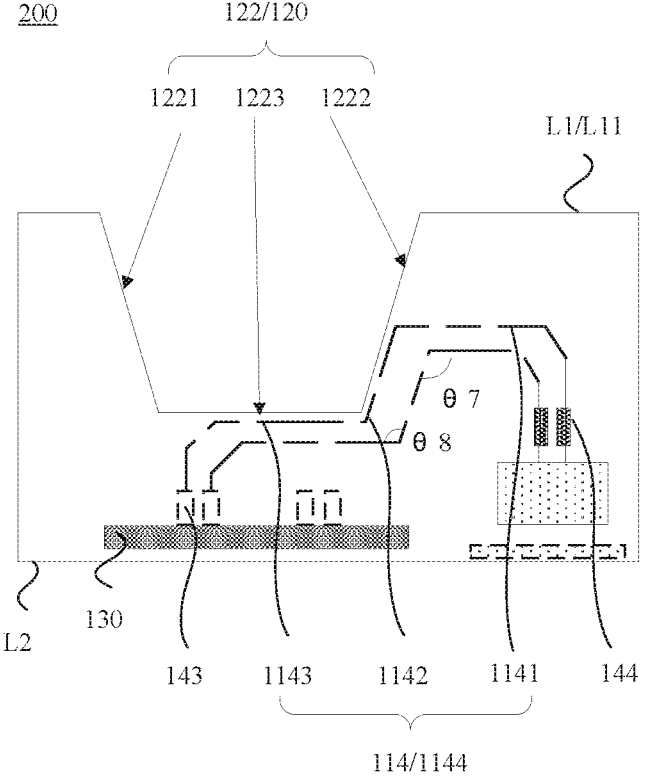
FIG. 4D is a structural diagram of a driving circuit board, in accordance with yet other embodiments.

FIG. 4D is a structural diagram of a driving circuit board, in accordance with yet other embodiments.

In some embodiments, as shown in FIG. 4D, the driving signal wiring 114 includes a first wiring segment 1144. The first wiring segment 1144 includes a first portion driving signal wiring 1141, a second portion driving signal wiring 1142 and a third portion driving signal wiring 1143. An extending direction of the first portion driving signal wiring 1141 is the same as the extending direction of the orthographic projection of the first edge L1 on the first reference plane.

The second portion driving signal wiring 1142 has a first second portion driving signal wiring connection end and a second second portion driving signal wiring connection end, and the first second portion driving signal wiring connection end is electrically connected to the first portion driving signal wiring 1141.

It will be understood that the first second portion driving signal wiring connection end is electrically connected to an end of the first portion driving signal wiring 1141.

The third portion driving signal wiring 1143 is electrically connected to the second second portion driving signal wiring connection end. That is, the third portion driving signal wiring 1143 is electrically connected to the end of the second portion driving signal wiring 1142 away from the first portion driving signal wiring 1141. Thus, an end of the second portion driving signal wiring 1142 is able to be electrically connected to the first portion driving signal wiring 1141, and another end of the second portion driving signal wiring 1142 is able to be electrically connected to the third portion driving signal wiring 1143. An extending direction of the third portion driving signal wiring 1143 is the same as the extending direction of the orthographic projection of the third wall surface 1223 on the first reference plane.

Moreover, the second portion driving signal wiring 1142 and the first portion driving signal wiring 1141 have a seventh included angle θ7 therebetween, and the seventh included angle θ7 is an obtuse angle. The second portion driving signal wiring 1142 and the third portion driving signal wiring 1143 have an eighth included angle θ8 therebetween, and the eighth included angle θ8 is an obtuse angle.

It will be understood that, as shown in FIG. 4D, the seventh included angle θ7 is an included angle between the second portion driving signal wiring 1142 and the first portion driving signal wiring 1141. The eighth included angle θ8 is an included angle between the second portion driving signal wiring 1142 and the third portion driving signal wiring 1143.

It will be noted that the extending direction of the first portion driving signal wiring 1141 may be the same as or approximately the same as the extending direction of the orthographic projection of the first edge L1 on the first reference plane. In other words, an extending tendency of the first portion driving signal wiring 1141 is the same as or approximately the same as an extending tendency of the orthographic projection of the first edge L1 on the first reference plane. That is, an orthographic projection of the first portion driving signal wiring 1141 on the first reference plane and the orthographic projection of the first edge L1 on the first reference plane may be parallel to each other, or may have a certain included angle (e.g., an included angle within 5°) therebetween.

Similarly, the extending direction of the third portion driving signal wiring 1143 may be the same as or approximately the same as the extending direction of the orthographic projection of the third wall surface 1223 on the first reference plane. In other words, an extending tendency of the third portion driving signal wirings 1143 is the same as or approximately the same as the extending tendency of the orthographic projection of the third wall surface 1223 on the first reference plane. That is, an orthographic projection of the third portion driving signal wiring 1143 on the first reference plane and the orthographic projection of the third wall surface 1223 on the first reference plane may be parallel to each other, or may have a certain included angle (e.g., an included angle within 5°) therebetween.

In some examples, the extending direction of the first portion driving signal wiring 1141 is the same as or approximately the same as an extending direction of an orthographic projection of a sub-edge L11 on the first reference plane. For example, in a case where the extending directions of the plurality of sub-edges L11 are the same, the extending direction of the first portion driving signal wiring 1141 is the same as or approximately the same as an extending direction of an orthographic projection of any sub-edge L11 on the first reference plane.

For example, as shown in FIG. 4D, an end of the first portion driving signal wiring 1141 away from the second portion driving signal wiring 1142 is electrically connected to the second filter 144. An end of the third portion driving signal wiring 1143 away from the second portion driving signal wiring 1142 is electrically connected to the first filter 143.

It will be understood that the end of the second portion driving signal wiring 1142 is electrically connected to the first portion driving signal wiring 1141, and the another end of the second portion driving signal wiring 1142 is electrically connected to the third portion driving signal wiring 1143. Moreover, the second portion driving signal wiring 1142 and the first portion driving signal wiring 1141 have the seventh included angle θ7 therebetween, and the seventh included angle θ7 is the obtuse angle. The second portion driving signal wiring 1142 and the third portion driving signal wiring 1143 have the eighth included angle θ8 therebetween, and the eighth included angle θ8 is the obtuse angle.

In this way, extending direction(s) of at least one driving signal wiring 114 are able to be changed, thereby realizing the signal transmission. For example, as shown in FIG. 4D, the extending direction(s) of the at least one driving signal wiring 114 are able to be changed, thereby bypassing the receiving structure 120 to realize the signal transmission.

Thus, the area utilization rate of the circuit board body 110 is improved. On one hand, the width H3 of the circuit board body 110 is able to be reduced, so that the width H2 of the side bezel of the display module 300 is able to be reduced, thereby realizing the narrow bezel of the display module 300 to improve the visual effect of the display module 300. On another hand, the area utilization rate of the circuit board body 110 is improved, so that the material consumption of the circuit board body 110 is able to be reduced, thereby reducing the cost of the circuit board body 110.

Moreover, when the extending direction(s) of the at least one driving signal wiring 114 are changed, an included angle between wirings is able to be an obtuse angle, so that a parasitic capacitance and a parasitic inductance generated when the extending direction(s) of the at least one driving signal wiring 114 are changed are reduced, so as to improve the transmission reliability of the signal, thereby improving the operational reliability of the driving circuit board 100.

It will be understood that in a case where the first edge L1 is parallel to or approximately parallel to the third wall surface 1223, the seventh included angle θ7 is the same as or approximately the same as the eighth included angle θ8.

In some examples, an extending direction of the second portion driving signal wiring 1142 is the same as or approximately the same as the extending direction of the orthographic projection of the first wall surface 1221 or the second wall surface 1222 on the first reference plane.

In some examples, as shown in FIG. 4D, the extending direction of the second portion driving signal wiring 1142 is the same as or approximately the same as the extending direction of the orthographic projection of the second wall surface 1222 on the first reference plane. In some other examples, the extending direction of the second portion driving signal wiring 1142 is the same as or approximately the same as the extending direction of the orthographic projection of the first wall surface 1221 on the first reference plane. In yet other examples, the second portion driving signal wiring 1142 includes two wiring segments. An extending direction of one of the two wiring segments is the same as or approximately the same as the extending direction of the orthographic projection of the first wall surface 1221 on the first reference plane, and an extending direction of another one of the two wiring segments is the same as or approximately the same as the extending direction of the orthographic projection of the second wall surface 1222 on the first reference plane.

It will be noted that the extending direction of the second portion driving signal wiring 1142 may be the same as or approximately the same as the extending direction of the orthographic projection of the first wall surface 1221 or the second wall surface 1222 on the first reference plane. In other words, an extending tendency of the second portion driving signal wiring 1142 is the same as or approximately the same as the extending tendency of the orthographic projection of the first wall surface 1221 or the second wall surface 1222 on the first reference plane. That is, an orthographic projection of the second portion driving signal wiring 1142 on the first reference plane and the orthographic projection of the first wall surface 1221 or the second wall surface 1222 on the first reference plane may be parallel to each other, or have a certain included angle (e.g., an included angle within 5°) therebetween.

The extending direction of the second portion driving signal wiring 1142 is set to be the same as or approximately the same as the extending direction of the orthographic projection of the first wall surface 1221 or the second wall surface 1222 on the first reference plane, so that the orthographic projection of the second portion driving signal wiring 1142 on the first reference plane is able to be matched with and close to the orthographic projection of the first wall surface 1221 or the second wall surface 1222 on the first reference plane, which reduces a distance between the second portion driving signal wiring 1142 and the first wall surface 1221 or between the second portion driving signal wiring 1142 and the second wall surface 1222, thereby improving he area utilization rate of the circuit board body 110 and reducing the width H3 of the circuit board body 110.

In some examples, an orthographic projection of at least a portion of each of at least one driving signal wiring 114 (including the first portion driving signal wiring 1141, the second portion driving signal wiring 1142 and the third portion driving signal wiring 1143) on the first reference plane is matched with and close to the orthographic projections of the first edge L1 and the sidewall surface 122 (including the first wall surface 1221, the second wall surface 1222, and the third wall surface 1223) on the first reference plane, so that a distance of each of the at least one driving signal wiring 114 from the first edge L1 and the sidewall surface 122 is reduced, thereby further improving the area utilization rate of the circuit board body 110 and reducing the width H3 of the circuit board body 110.

It can be seen from the above that, in some examples, as shown in FIG. 3A, the first included angle θ1, the second included angle θ2, the third included angle θ3, and the fourth included angle θ4 are all obtuse angles. Therefore, the at least a portion of the driving signal wiring 114 may be arranged to extend in extending directions of edges of the receiving structure 120, so that when the extending direction of the driving signal wiring 114 is changed to bypass the receiving structure 120, the driving signal wiring 114 is a wiring with obtuse angles. On one hand, the area utilization rate of the circuit board body 110 is improved, and on another hand, the convenience of wiring is able to be improved, thereby improving the processing convenience of the circuit board body 110.

In some embodiments, as shown in FIG. 4A, the circuit board body 110 further includes power signal wiring(s) 115.

The plurality of electronic elements 140 include a power driving chip 145 and third filter(s) 146. The power driving chip 145 is electrically connected to a connector 141. The third filter 146 is arranged adjacent to the bonding component 130. An input end of the third filter 146 is electrically connected to the power driving chip 145 through the power signal wiring 115, and an output end of the third filter 146 is electrically connected to the bonding component 130.

In some examples, the power driving chip (i.e., power management integrated circuit, PMIC) 145 is electrically connected to the connector 141 through the signal wiring 113 on the circuit board body 110.

It can be seen from the above that, the circuit board body 110 includes the plurality of signal wirings 113. In some examples, the plurality of signal wirings 113 include the power signal wiring(s) 115.

It will be understood that the connector 141 is used for receiving a power signal from the outside of the circuit board assembly 200 and transmitting the power signal to the power driving chip 145.

It will be understood that the input end of the third filter 146 is electrically connected to the power driving chip 145 through the power signal wiring 115, and the output end of the third filter 146 is electrically connected to the bonding component 130. In this arrangement, the third filter 146 is able to filter a signal transmitted from the power driving chip 145 to the bonding component 130, so as to reduce distortion of the signal in the transmission process, so that the integrity of the signal is improved, thereby improving transmission reliability of the signal. That is, the reliability of the driving circuit board 100 is improved.

It will be understood that since the bonding component 130 is bonded to the end of the flexible printed circuit 210, and the driving chip 220 is installed on the flexible printed circuit 210, the signal output from the power driving chip 145 is able to be transmitted to the driving chip 220 through the bonding component 130, thereby driving the display panel 310 and enabling the display panel 310 to realize the image display function. In some examples, the power driving chip 145 is used for outputting a voltage signal.

In some examples, the third filter 146 is a resistance-capacitance filter. That is, the third filter 146 includes a resistor and a capacitor, so that the third filter 146 is able to realize a filtering function.

It will be understood that the smaller the distance between the third filter 146 and the bonding component 130, the less distortion of the signal when the signal is transmitted between the third filter 146 and the bonding component 130, and the higher the transmission reliability of the signal.

Therefore, the third filter 146 is arranged adjacent to the bonding component 130, so that a transmission distance between the third filter 146 and the bonding component 130 is able to be reduced, and thus a transmission path of the signal filtered by the third filter 146 is shortened, thereby reducing the distortion of the signal in the transmission process to improve the transmission reliability of the signal.

It will be understood that the third filter 146 and the bonding component 130 may be located on the same main surface (the first main surface 111 or the second main surface 112), or may be located on different main surfaces (the first main surface 111 or the second main surface 112). The third filter 146 is arranged adjacent to the bonding component 130. That is, an orthographic projection of the third filter 146 on the first reference plane is adjacent to the orthographic projection of the bonding component 130 on the first reference plane.

In some embodiments, as shown in FIG. 4A, the third filter 146 is located on a side of the bonding component 130 away from the second edge L2, and the third filter 146 is located on the second main surface 112.

It will be understood that the third filter 146 is disposed on the side of the bonding component 130 away from the second edge L2, so that the width H3 of the circuit board body 110 is able to be further reduced, thereby reducing the width H2 of the side bezel of the display module 300.

Since the bonding component 130 is located on the first main surface 111, and the third filter 146 is disposed on the second main surface 112, an interaction between the third filter 146 and the flexible printed circuit 210 is avoided when the flexible printed circuit 210 is bonded to the bonding component 130, thereby improving the reliability of the driving circuit board 100.

It can be seen from the above that, as shown in FIG. 4A, the connector 141 is electrically connected to the timing controller 142 and the power driving chip 145. The timing controller 142 is electrically connected to the bonding component 130 through the driving signal wiring 114, and the power driving chip 145 is electrically connected to the bonding component 130 through the power signal wiring 115. The bonding component 130 is bonded to the flexible printed circuit 210, so that signals output from the timing controller 141 and the power driving chip 145 are able to be transmitted to the driving chip 220 installed on the flexible printed circuit 210 through the bonding component 130.

For example, a communication protocol between the connector 141 and the timing controller 142 is different from a communication protocol between the connector 141 and the power driving chip 145. After receiving the signal from the outside, the connector 141 transmits the control signal to the timing controller 142 according to the communication protocol between the connector 141 and the timing controller 142. For example, the control signal may be a data signal. Similarly, after receiving the signal from the outside, the connector 141 transmits a power signal to the power driving chip 145 according to the communication protocol between the connector 141 and the power driving chip 145. For example, the power signal is a voltage signal.

The received signals are respectively processed by the timing controller 141 and the power driving chip 145, and then transmitted to different bonding components 130, and are transmitted to respective driving chips 220 respectively installed on the flexible printed circuits 210 through the flexible printed circuits 210 respectively bonded to the bonding components. The signals are respectively processed by the driving chips 220, and then transmitted to the display panel 310, so that the display panel 310 is able to realize the image display function.

In some examples, the power driving chip 145 is electrically connected to the timing controller 142, so that the power driving chip 145 is able to supply an operating power to the timing controller 142. In some other examples, the power driving chip 145 does not need to be electrically connected to the timing controller 142, and the connector 141 supplies an operating power to the timing controller 142.

In some examples, as shown in FIGS. 3F and 3G, the driving circuit board 100 further includes a backlight module interface 148. For example, the backlight module interface 148 is able to be electrically connected to the backlight module. The driving circuit board 100 further includes a backlight module controller (not shown in the figures). An electrical signal output from the backlight module controller is able to be transmitted to the backlight module interface 148, and is transmitted to the backlight module through the backlight module interface 148, so as to control the backlight module.

In some examples, the second main surface 112 is closer to the backlight module than the first main surface 111, and the backlight module interface 148 is located in the second main surface 112, so that a distance between the backlight module interface 148 and the backlight module is shortened, and the convenience of connecting the backlight module interface 148 to the backlight module is improved.

Figure 4E:
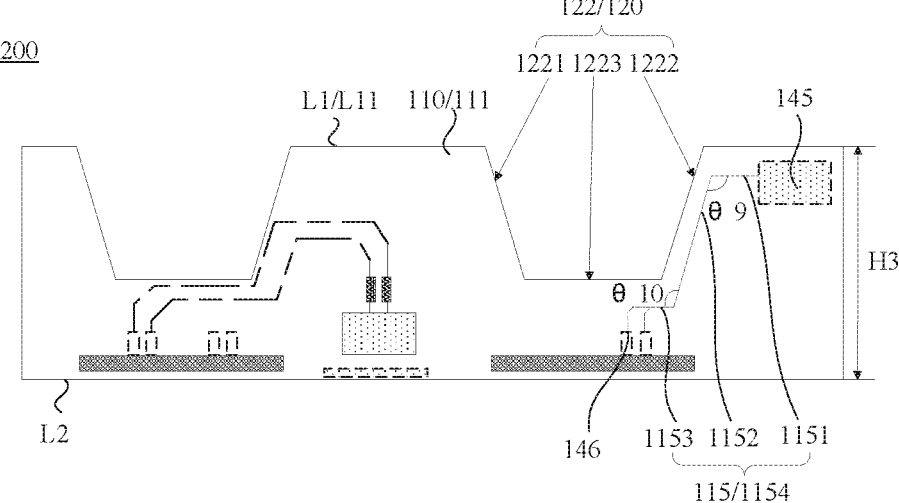
FIG. 4E is a structural diagram of a driving circuit board, in accordance with yet other embodiments.
Figure 4F:
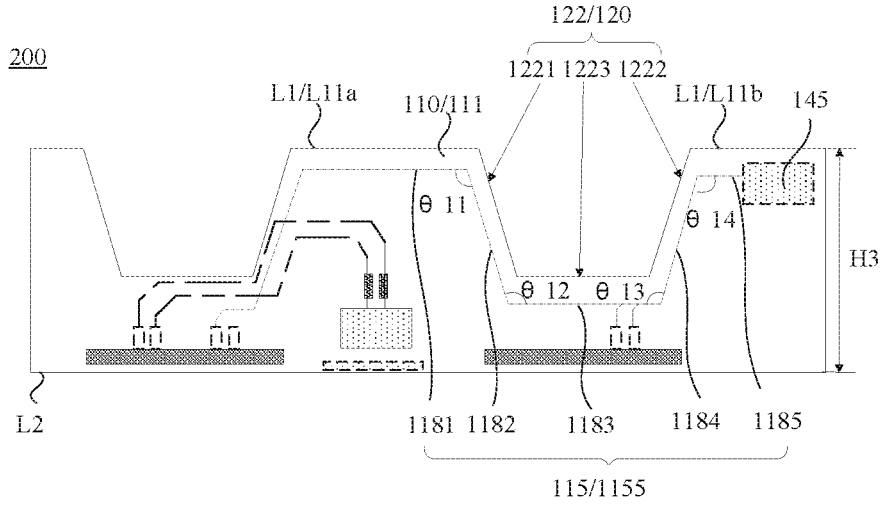
FIG. 4F is a structural diagram of a driving circuit board, in accordance with yet other embodiments.

FIG. 4E is a structural diagram of a driving circuit board, in accordance with yet other embodiments. FIG. 4F is a structural diagram of a driving circuit board, in accordance with yet other embodiments.

In some embodiments, as shown in FIGS. 4E and 4F, the power signal wiring 115 includes a second wiring segment 1154 and/or a third wiring segment 1155.

For example, as shown in FIG. 4E, the second wiring segment 1154 includes a first portion power signal wiring 1151, a second portion power signal wiring 1152 and a third portion power signal wiring 1153. An extending direction of the first portion power signal wiring 1151 is the same as the extending direction of the orthographic projection of the first edge L1 on the first reference plane.

The second portion power signal wiring 1152 has a first second portion power signal wiring connection end and a second second portion power signal wiring connection end. The first second portion power signal wiring connection end is electrically connected to the first portion power signal wiring 1151. It will be understood that the first second portion power signal wiring connection end is electrically connected to an end of the first portion power signal wiring 1151.

The third portion power signal wiring 1153 is electrically connected to the second second portion power signal wiring connection end. That is, the third portion power signal wiring 1153 is electrically connected to an end of the second portion power signal wiring 1152 away from the first portion power signal wiring 1151. In this way, an end of the second portion power signal wiring 1152 is able to be electrically connected to the first portion power signal wiring 1151, and another end of the second portion power signal wiring 1152 is able to be electrically connected to the third portion power signal wiring 1153. An extending direction of the third portion power signal wiring 1153 is the same as the extending direction of the orthographic projection of the third wall surface 1223 on the first reference plane.

Moreover, the second portion power signal wiring 1152 and the first portion power signal wiring 1151 have a ninth included angle θ9 therebetween, and the ninth included angle θ9 is an obtuse angle. The second portion power signal wiring 1152 and the third portion power signal wiring 1153 have a tenth included angle θ10 therebetween, and the tenth included angle θ10 is an obtuse angle.

It will be understood that as shown in FIG. 4E, the ninth included angle θ9 is an included angle located between the second portion power signal wiring 1152 and the first portion power signal wiring 1151. The tenth included angle θ10 is an included angle located between the second portion power signal wiring 1152 and the third portion power signal wiring 1153.

It will be noted that the extending direction of the first portion power signal wiring 1151 may be the same as or approximately the same as the extending direction of the orthographic projection of the first edge L1 on the first reference plane. In other words, an extending tendency of the first portion power signal wiring 1151 is the same as or approximately the same as the extending tendency of the orthographic projection of the first edge L1 on the first reference plane. That is, an orthographic projection of the first portion power signal wiring 1151 on the first reference plane and the orthographic projection of the first edge L1 on the first reference plane may be parallel to each other, or may have a certain included angle (e.g., an included angle within 5°) therebetween.

Similarly, the extending direction of the third portion power signal wiring 1153 may be the same as or approximately the same as the extending direction of the orthographic projection of the third wall surface 1223 on the first reference plane. In other words, an extending tendency of the third portion power signal wiring 1153 is the same as or approximately the same as the extending tendency of the orthographic projection of the third wall surface 1223 on the first reference plane. That is, an orthographic projection of the third portion power signal wiring 1153 on the first reference plane and the orthographic projection of the third wall surface 1223 on the first reference plane may be parallel to each other, or may have a certain included angle (e.g., an included angle within 5°) therebetween.

In some examples, the extending direction of the first portion power signal wiring 1151 is the same as or approximately the same as an extending direction of an orthographic projection of a sub-edge L11 on the first reference plane. For example, in the case where the extending directions of the plurality of sub-edges L11 are the same, the extending direction of the first portion power signal wiring 1151 is the same as or approximately the same as an extending direction of an orthographic projection of any sub-edge L11 on the first reference plane.

For example, as shown in FIG. 4E, an end of the first portion power signal wiring 1151 away from the second portion power signal wiring 1152 is electrically connected to the power driving chip 145. An end of the third portion power signal wiring 1153 away from the second portion power signal wiring 1152 is electrically connected to the third filter 146.

It will be understood that the end of the second portion power signal wiring 1152 is electrically connected to the first portion power signal wiring 1154, and the another end of the second portion power signal wiring 1152 is electrically connected to the third portion power signal wiring 1153. Moreover, the second portion power signal wiring 1152 and the first portion power signal wiring 1151 have the ninth included angle θ9 therebetween, and the ninth included angle θ9 is the obtuse angle. The second portion power signal wiring 1152 and the third portion power signal wiring 1153 have the tenth included angle θ10 therebetween, and the tenth included angle θ10 is the obtuse angle. In this way, extending direction(s) of at least one power signal wiring 115 are able to be changed to realize the signal transmission. For example, as shown in FIG. 4E, the extending direction(s) of the at least one power signal wiring 115 are able to be changed to bypass the receiving structure(s) 120 to realize the signal transmission.

Thus, the area utilization rate of the circuit board body 110 is improved. On one hand, the width H3 of the circuit board body 110 is able to be reduced, so that the width H2 of the side bezel of the display module 300 is able to be reduced, thereby realizing the narrow bezel of the display module 300 to improve the visual effect of the display module 300. On another hand, the area utilization rate of the circuit board body 110 is improved, so that the material consumption of the circuit board body 110 is able to be reduced, thereby reducing the cost of the circuit board body 110.

Moreover, when the extending direction(s) of the at least one power signal wiring 115 are changed, an included angle between wirings is able to be an obtuse angle, so that a parasitic capacitance and a parasitic inductance generated when the extending direction(s) of the at least one power signal wiring 115 are changed are reduced, so as to improve the transmission reliability of the signal, thereby improving the operational reliability of the driving circuit board 100.

It will be understood that in the case where the first edge L1 is parallel to or approximately parallel to the third wall surface 1223, the ninth included angle θ9 is the same as or approximately the same as the tenth included angle θ10.

In some examples, as shown in FIG. 4E, an extending direction of the second portion power signal wiring 1152 is the same as the extending direction of the orthographic projection of the first wall surface 1221 or the second wall surface 1222 on the first reference plane.

It will be noted that the extending direction of the second portion power signal wiring 1152 may be the same as or approximately the same as the extending direction of the orthographic projection of the first wall surface 1221 or the second wall surface 1222 on the first reference plane. In other words, an extending tendency of the second portion power signal wiring 1152 is the same as or approximately the same as the extending tendency of the orthographic projection of the first wall surface 1221 or the second wall surface 1222 on the first reference plane. That is, an orthographic projection of the second portion power signal wiring 1152 on the first reference plane and the orthographic projection of the first wall surface 1221 or the second wall surface 1222 on the first reference plane may be parallel to each other, or may have a certain included angle (e.g., an included angle within 5°) therebetween.

The extending direction of the second portion power signal wiring 1152 is set to be the same as or approximately the same as the extending direction of the orthographic projection of the first wall surface 1221 or the second wall surface 1222 on the first reference plane, so that the orthographic projection of the second portion power signal wirings 1152 on the first reference plane is able to be matched with and close to the orthographic projection of the first wall surface 1221 or the second wall surface 1222 on the first reference plane, which reduces a distance between the second portion power signal wiring 1152 and the first wall surface 1221 or a distance between the second portion power signal wiring 1152 and the second wall surface 1222, thereby improving the area utilization rate of the circuit board body 110 and reducing the width H3 of the circuit board body 110.

In some examples, an orthographic projection of at least a portion of each of at least one power signal wiring 115 (including the first portion power signal wiring 1151, the second portion power signal wiring 1152 and the third portion power signal wiring 1153) on the first reference plane is matched with and close to the orthographic projections of the first edge L1 and the sidewall surface 122 (including the first wall surface 1221, the second wall surface 1222 and the third wall surface 1223) on the first reference plane, which reduces a distance of each of the at least one power signal wiring 115 from the first edge L1 and the sidewall surface 122, thereby further improving the area utilization rate of the circuit board body 110 and reducing the width H3 of the circuit board body 110.

It can be seen from the above that, in some examples, as shown in FIG. 3A, the first included angle θ1, the second included angle θ2, the third included angle θ3 and the fourth included angle 64 are all obtuse angles. Therefore, the at least a portion of the power signal wiring 115 may be arranged to extend in the extending directions of the edges of the receiving structure 120, so that when the extending direction of the power signal wiring 115 is changed to bypasses the receiving structure 120, the power signal wiring 115 is a wiring with obtuse angles. On one hand, the area utilization rate of the circuit board body 110 is improved, and on another hand, the convenience of wiring is able to be improved, thereby improving the processing convenience of the circuit board body 110.

For example, as shown in FIG. 4F, the third wiring segment 1155 includes a fourth portion power signal wiring 1181, a fifth portion power signal wiring 1182, a sixth portion power signal wiring 1183, a seventh portion power signal wiring 1184 and an eighth portion power signal wiring 1185.

An extending direction of the fourth portion power signal wiring 1181 is the same as an extending direction of an orthographic projection of the first sub-edge L11a on the first reference plane.

The fifth portion power signal wiring 1182 has a first fifth portion power signal wiring connection end and a second fifth portion power signal wiring connection end. The first fifth portion power signal wiring connection end is electrically connected to the fourth portion power signal wiring 1181. It will be understood that the first fifth portion power signal wiring connection end is electrically connected to an end of the fourth portion power signal wiring 1181.

The sixth portion power signal wiring 1183 has a first sixth portion power signal wiring connection end and a second sixth portion power signal wiring connection end. The first sixth portion power signal wiring connection end is electrically connected with the second fifth portion power signal wiring connection end. That is, the sixth power signal wiring 1183 is electrically connected to an end of the fifth power signal wiring 1182 away from the fourth power signal wiring 1181. An extending direction of the sixth portion the power signal wiring 1183 is the same as the extending direction of the orthographic projection of the third wall surface 1223 on the first reference plane.

The seventh portion power signal wiring 1184 has a first seventh portion power signal wiring connection end and a second seventh portion power signal wiring connection end. The first seventh portion power signal wiring connection end is electrically connected to the second sixth portion power signal wiring connection end. That is, the seventh portion power signal wiring 1184 is electrically connected to an end of the sixth portion power signal wiring 1183 away from the fifth portion power signal wiring 1182.

The eighth portion power signal wiring 1185 is electrically connected to the second seventh portion power signal wiring connection end. That is, the eighth portion power signal wiring 1185 is electrically connected to an end of the seventh portion power signal wiring 1184 away from the sixth portion power signal wiring 1183. An extending direction of the eighth portion power signal wiring 1185 is the same as an extending direction of an orthographic projection of the second sub-edge L11b on the first reference plane.

Moreover, the fifth portion power signal wiring 1182 and the fourth portion power signal wiring 1181 have an eleventh included angle θ11 therebetween, and the eleventh included angle θ11 is an obtuse angle. The fifth portion power signal wiring 1182 and the sixth portion power signal wiring 1183 have a twelfth included angle θ12 therebetween, and the twelfth included angle θ12 is an obtuse angle. The seventh portion power signal wiring 1184 and the sixth portion power signal wiring 1183 have a thirteenth included angle θ13 therebetween, and the thirteenth included angle θ13 is an obtuse angle. The seventh portion power signal wiring 1184 and the eighth portion power signal wiring 1185 have a fourteenth included angle θ14 therebetween, and the fourteenth included angle θ14 is an obtuse angle.

It will be understood that, as shown in FIG. 4F, the eleventh included angle θ11 is an included angle located between the fourth portion power signal wiring 1181 and the fifth portion power signal wiring 1182. The twelfth included angle θ12 is an included angle located between the fifth portion power signal wiring 1182 and the sixth portion power signal wiring 1183. The thirteenth included angle θ13 is an included angle located between the sixth portion power signal wiring 1183 and the seventh portion power signal wiring 1184. The twelfth included angle θ12 is an included angle located between the seventh portion power signal wiring 1184 and the eighth portion power signal wiring 1185.

It will be noted that the extending direction of the fourth portion power signal wiring 1181 may be the same as or approximately the same as the extending direction of the orthographic projection of the first sub-edge L11a on the first reference plane. In other words, an extending tendency of the fourth portion power signal wiring 1181 is the same as or approximately the same as an extending tendency of the orthographic projection of the first sub-edge L11a on the first reference plane. That is, an orthographic projection of the fourth portion power signal wiring 1181 on the first reference plane and the orthographic projection of the first sub-edge L11a on the first reference plane may be parallel to each other, or may have a certain included angle (e.g., an included angle within 5°) therebetween.

Similarly, the extending direction of the sixth portion power signal wiring 1183 may be the same as or approximately the same as the extending direction of the orthographic projection of the third wall surface 1223 on the first reference plane. In other words, an extending tendency of the sixth portion power signal wiring 1183 is the same as or approximately the same as the extending tendency of the orthographic projection of the third wall surface 1223 on the first reference plane. That is, an orthographic projection of the sixth portion power signal wiring 1183 on the first reference plane and the orthographic projection of the third wall surface 1223 on the first reference plane may be parallel to each other, or may have a certain included angle (e.g., an included angle within) 5° therebetween.

Similarly, the extending direction of the eighth portion power signal wiring 1185 may be the same as or approximately the same as the extending direction of the orthographic projection of the second sub-edge L11b on the first reference plane. In other words, an extending tendency of the eighth portion power signal wiring 1185 is the same as or approximately the same as the extending tendency of the orthographic projection of the second sub-edge L11b on the first reference plane. That is, an orthographic projection of the eighth portion power signal wiring 1185 on the first reference plane and the orthographic projection of the second sub-edge L11b on the first reference plane may be parallel to each other, or may have a certain included angle (e.g., an included angle within) 5° therebetween.

For example, as shown in FIG. 4F, an end of the eighth portion power signal wiring 1185 away from the seventh portion power signal wiring 1184 is electrically connected to the power driving chip 145.

In some examples, in the case where the extending directions of the plurality of sub-edges L11 are the same, the extending directions of the fourth portion power signal wiring 1181 and the eighth portion power signal wiring 1185 are the same as an extending direction of an orthographic projection of any sub-edge L11 on the first reference plane.

It will be understood that an end of the fifth portion power signal wiring 1182 is electrically connected to the fourth portion power signal wiring 1181, and another end of the fifth p portion power signal wiring 1182 is electrically connected to the sixth portion power signal wiring 1183. Moreover, the fifth portion power signal wiring 1182 and the fourth portion power signal wiring 1181 have the eleventh included angle θ11 therebetween, and the eleventh included angle θ11 is the obtuse angle. The fifth portion power signal wiring 1182 and the sixth portion power signal wiring 1183 have the twelfth included angle θ12 therebetween, and the twelfth included angle θ12 is the obtuse angle. An end of the seventh portion power signal wiring 1184 is electrically connected to the sixth portion power signal wiring 1183, and another end of the seventh portion power signal wiring 1184 is electrically connected to the eighth portion power signal wiring 1185. Moreover, the seventh portion power signal wiring 1184 and the sixth portion power signal wiring 1183 have the thirteenth included angle θ13 therebetween, and the thirteenth included angle θ13 is the obtuse angle. The seventh portion power signal wiring 1184 and the eighth portion power signal wiring 1185 have the fourteenth included angle θ14 therebetween, and the fourteenth included angle θ14 is the obtuse angle.

In this way, extending direction(s) of at least one power signal wiring 115 are able to be changed to realize the signal transmission. For example, as shown in FIG. 4F, the extending direction(s) of the at least one power signal wiring 115 are able to be changed to bypass the receiving structure(s) 120 to realize the signal transmission.

Thus, the area utilization rate of the circuit board body 110 is improved. On one hand, the width H3 of the circuit board body 110 is able to be reduced, so that the width H2 of the side bezel of the display module 300 is able to be reduced, thereby realizing the narrow bezel of the display module 300 to improve the visual effect of the display module 300. On another hand, the area utilization rate of the circuit board body 110 is improved, so that the material consumption of the circuit board body 110 is able to be reduced, thereby reducing the cost of the circuit board body 110.

Moreover, when the extending direction(s) of the at least one power signal wiring 115 are changed, an included angle between wirings is able to be an obtuse angle, so that a parasitic capacitance and a parasitic inductance generated when the extending direction(s) of the at least one power signal wiring 115 are changed are reduced, so as to improve the transmission reliability of the signal, thereby improving the operational reliability of the driving circuit board 100.

It will be understood that in the case where the first edge L1 is parallel to or approximately parallel to the third wall surface 1223, the eleventh included angle θ11 is the same as or approximately the same as the twelfth included angle θ12, and the thirteenth included angle θ13 is the same as or approximately the same as the fourteenth included angle θ14.

In some examples, as shown in FIG. 4F, an extending direction of the fifth portion power signal wiring 1182 is the same as the extending direction of the orthographic projection of the first wall surface 1221 on the first reference plane. An extending direction of the seventh portion power signal wiring 1184 is the same as the extending direction of the orthographic projection of the second wall surface 1222 on the first reference plane.

It will be noted that the extending direction of the fifth portion power signal wiring 1182 may be the same as or approximately the same as the extending direction of the orthographic projection of the first wall surface 1221 on the first reference plane. In other words, an extending tendency of the fifth portion power signal wiring 1182 is the same as or approximately the same as the extending tendency of the orthographic projection of the first wall surface 1221 on the first reference plane. That is, an orthographic projection of the fifth portion power signal wiring 1182 on the first reference plane and the orthographic projection of the first wall surface 1221 on the first reference plane may be parallel to each other, or may have a certain included angle (e.g., an included angle within) 5°) therebetween.

The extending direction of the seventh portion power signal wiring 1184 may be the same as or approximately the same as the extending direction of the orthographic projection of the second wall surface 1222 on the first reference plane. In other words, an extending tendency of the seventh portion power signal wiring 1184 is the same as or approximately the same as the extending tendency of the orthographic projection of the second wall surface 1222 on the first reference plane. That is, an orthographic projection of the seventh portion power signal wiring 1184 on the first reference plane and the orthographic projection of the second wall surface 1222 on the first reference plane may be parallel to each other, or may have a certain included angle (e.g., an included angle within) 5°) therebetween.

The extending direction of the fifth portion power signal routing line 1182 is set to be the same as or approximately the same as the extending direction of the orthographic projection of the first wall surface 1221 on the first reference plane, so that the orthographic projection of the fifth portion power signal wiring 1182 on the first reference plane is able to be matched with and close to the orthographic projection of the first wall surface 1221 on the first reference plane, which reduces a distance between the fifth portion power signal wiring 1182 and the first wall surface 1221, thereby improving the area utilization rate of the circuit board body 110 and reducing the width H3 of the circuit board body 110.

The extending direction of the seventh portion power signal wiring 1184 is set to be the same as or approximately the same as the extending direction of the orthographic projection of the second wall surface 1222 on the first reference plane, so that the orthographic projection of the seventh portion power signal wiring 1184 on the first reference plane is able to be matched with and close to the orthographic projection of the second wall surface 1222 on the first reference plane, which reduces a distance between the seventh portion power signal wiring 1184 and the second wall surface 1222, thereby improving the area utilization rate of the circuit board body 110 and reducing the width H3 of the circuit board body 110.

In some examples, an orthographic projection of at least a portion of each of at least one power signal wiring 115 (including the fourth portion power signal wiring 1181, the fifth portion power signal wiring 1182, the sixth portion power signal wiring 1183, the seventh portion power signal wiring 1184 and the eighth portion power signal wiring 1185) on the first reference plane is matched with and close to the orthographic projections of the first edge L1 and the sidewall surface 122 (including the first wall surface 1221, the second wall surface 1222 and the third wall surface 1223) on the first reference plane, which reduces a distance of each of the at least one power signal wiring 115 from the first edge L1 and the sidewall surface 122, thereby further improving the area utilization rate of the circuit board body 110 and reducing the width H3 of the circuit board body 110.

It can be seen from the above that, in some examples, as shown in FIG. 3A, the first included angle θ1, the second included angle θ2, the third included angle θ3 and the fourth included angle θ4 are all obtuse angles. Therefore, the at least a portion of the power signal wiring 115 may be arranged to extend in the extending directions of the edges of the receiving structure 120, so that when the extending direction of the power signal wiring 115 is changed to bypasses the receiving structure 120, the power signal wiring 115 is a wiring with obtuse angles. On one hand, the area utilization rate of the circuit board body 110 is improved, and on another hand, the convenience of wiring is able to be improved, thereby improving the processing convenience of the circuit board body 110.

It can be seen from the above that, the timing controller 142 is able to be electrically connected to the bonding component 130 through the driving signal wiring 114, and the power driving chip 145 is able to be electrically connected to the bonding component 130 through the power signal wiring 115.

In some examples, in a case where a plurality of bonding components 130 are disposed on the circuit board body 100, the timing controller 142 needs to be electrically connected to different bonding components 130 through a plurality of driving signal wirings 114. The plurality of driving signal wirings 114 each include a first wiring segment 1144. That is, when an extending direction of any driving signal wiring 114 is changed to bypass the receiving structure 120, this driving signal wiring 114 is able to be a wiring with obtuse angles and extend in the edge of the opening 121.

Similarly, in some examples, in the case where the plurality of bonding components 130 are disposed on the circuit board body 100, the power driving chip 145 needs to be electrically connected to different bonding components 130 through a plurality of power signal wirings 115. The plurality of power signal wirings 115 each include a second wiring segment 1154 and/or a third wiring segment 1155. That is, when an extending direction of any power signal wiring 115 is changed to bypass the receiving structure 120, this power signal wiring 115 is able to be a wiring with obtuse angles and extend in the edge of the opening 121.

In this way, a parasitic capacitance and a parasitic inductance generated when the extending directions of the driving signal wiring 114 and the power signal wiring 115 are changed are reduced, so as to improve the transmission reliability of the signal, thereby improving the reliability of the driving circuit board 100. Moreover, the area utilization rate of the circuit board body 110 is able to be improved.

Figure 4G:
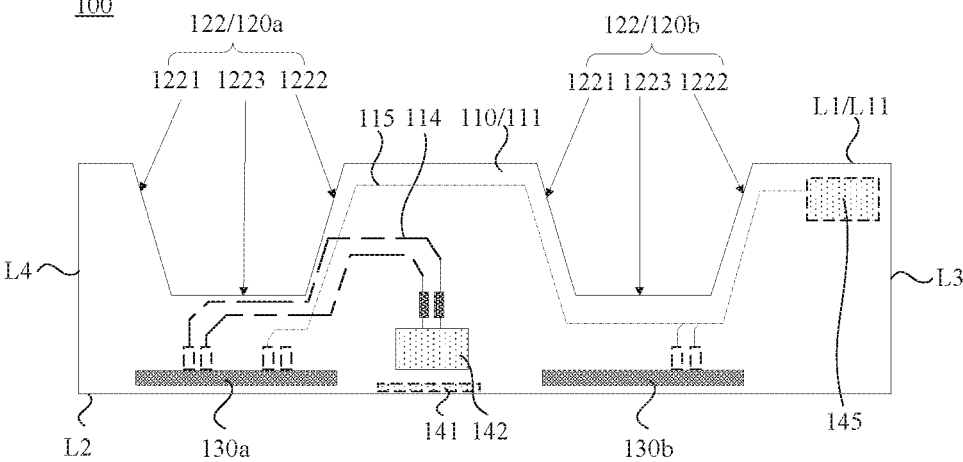
FIG. 4G is a structural diagram of a driving circuit board, in accordance with yet other embodiments.

FIG. 4G is a structural diagram of a driving circuit board, in accordance with yet other embodiments.

In some embodiments, as shown in FIG. 4G, the circuit board body 110 further has a third edge L3 and a fourth edge L4 opposite to each other. An end of the first edge L1 is connected to the third edge L3, and another end of the first edge L1 is connected to the fourth edge L4. An end of the second edge L2 is connected to an end of the third edge L3 away from the first edge L1, and another end of the second edge L2 is connected to an end of the fourth edge L4 away from the first edge L1.

For example, the third edge L3 is parallel to or approximately parallel to the fourth edge L4.

There are a plurality of receiving structures 120, and the plurality of receiving structures 120 are spaced apart along the extending direction of the second edge L2. The plurality of receiving structures 120 include first receiving structure(s) 120a and second receiving structure(s) 120b. The second receiving structure 120b is closer to the third edge L3 than the first receiving structure 120a.

It will be understood that the first receiving structure 120a and the second receiving structure 120b are only used for distinguishing any two adjacent receiving structures 120 spaced apart along the extending direction of the second edge L2, and the receiving structures 120 are not further limited.

There are a plurality of bonding components 130, and the plurality of bonding components 130 are spaced apart along the extending direction of the second edge L2. The plurality of bonding components 130 include first bonding component(s) 130a and second bonding component(s) 130b. The second bonding component 130b is closer to the third edge L3 than the first bonding component 130a.

It will be understood that the first bonding component 130a and the second bonding component 130b are only used for distinguishing any two adjacent bonding components 130 spaced apart along the extending direction of the second edge L2, and the bonding components 130 are not further limited.

At least a portion of the first bonding component 130a is located between the first receiving structure 120a and the second edge L2. At least a portion of the second bonding component 130b is located between the second receiving structure 120b and the second edge L2.

In some examples, the at least a portion of the first bonding component 130a is located between a third wall surface 1223 of the first receiving structure 120a and the second edge L2. The at least a portion of the second bonding component 130b is located between a third wall surface 1223 of the second receiving structure 120b and the second edge L2.

The connector 141 and the timing controller 142 are located among the first receiving structure 120a, the second receiving structure 120b, the first bonding component 130a and the second bonding component 130b. In some examples, the connector 141 is located between the first bonding component 130a and the second bonding component 130b, and the timing controller 142 is located between the first receiving structure 120a and the second receiving structure 120b. Thus, when the end of the flexible printed circuit 210 is bonded to the bonding component 130, as shown in FIG. 4A, the timing controller 142 is able to be located between two adjacent flexible printed circuits 210.

It will be understood that the first receiving structure 120a and the second receiving structure 120b are any two adjacent receiving structures 120 spaced apart along the extending direction of the second edge L2, and the first bonding component 130a and the second bonding component 130b are any two adjacent bonding components 130 spaced apart along the extending direction of the second edge L2. That is, the connector 141 and the timing controller 142 are able to be located among any two adjacent receiving structures 120 and any two adjacent bonding components 130.

The power driving chip 145 is located on a side of the second receiving structure 120b proximate to the third edge L3. In some examples, the power driving chip 145 is located at a corner between the first edge L1 and the third edge L3.

It will be understood that, as shown in FIG. 4A, by using the above arrangements, the area utilization rate of the circuit board body 110 is able to be improved, so that the width H3 of the circuit board body 110 is further reduced, and the width H2 of the side bezel of the display module 300 is reduced, thereby realizing the narrow bezel of the display module 300.

In another aspect, as shown in FIG. 2B, embodiments of the present disclosure provide a driving circuit board 100.

The driving circuit board 100 includes a circuit board body 110 and bonding component(s) 130. The circuit board body 110 has a first surface 111 and a second surface 112 opposite to each other. The bonding component 130 is located on the first main surface 111. The circuit board body 110 has a first edge L1 and a second edge L2 opposite to each other, and the first edge L1 is closer to a bonding side of a display panel 310 than the second edge L2. The circuit board body 110 is provided with receiving structure(s) 120 therein. The receiving structure 120 has at least an opening 121 in the first main surface 111, and the opening 121 of the receiving structure 120 is closer to the first edge L1 than the bonding component 130.

It will be understood that the driving circuit board 100 provided in the embodiments of the present disclosure may be applied to the display module 300 in the above embodiments, and has all the features and beneficial effects in the above embodiments, which will not be repeated here.

For example, when the end of the flexible printed circuit 210 is bonded to the bonding component 130 and the another end of the flexible printed circuit 210 is bonded to the bonding side of the display panel 310, an orthographic projection of the driving chip 220 installed on the flexible printed circuit 210 on the first reference plane is located inside an orthographic projection of the edge of the opening 121 on the first reference plane. The driving chip 220 is installed on the flexible printed circuit 210, and is located on the side of the flexible printed circuit 210 proximate to the driving circuit board 100. The first reference plane is parallel to the first main surface 111.

It will be understood that the driving circuit board 100 provided in the embodiments of the present disclosure is able to be applied not only to the display module 300, but also to a touch module, a tablet module, and a flat panel detector module. The application of the driving circuit board 100 is not further limited in the embodiments of the present disclosure.

In yet another aspect, embodiments of the present disclosure provide a circuit board assembly 200. The circuit board assembly 200 includes the driving circuit board 100, the flexible printed circuit(s) 210 and the driving chip(s) 220 as described above, and thus has all the above beneficial effects, which will not be repeated here.

Figure 5A:
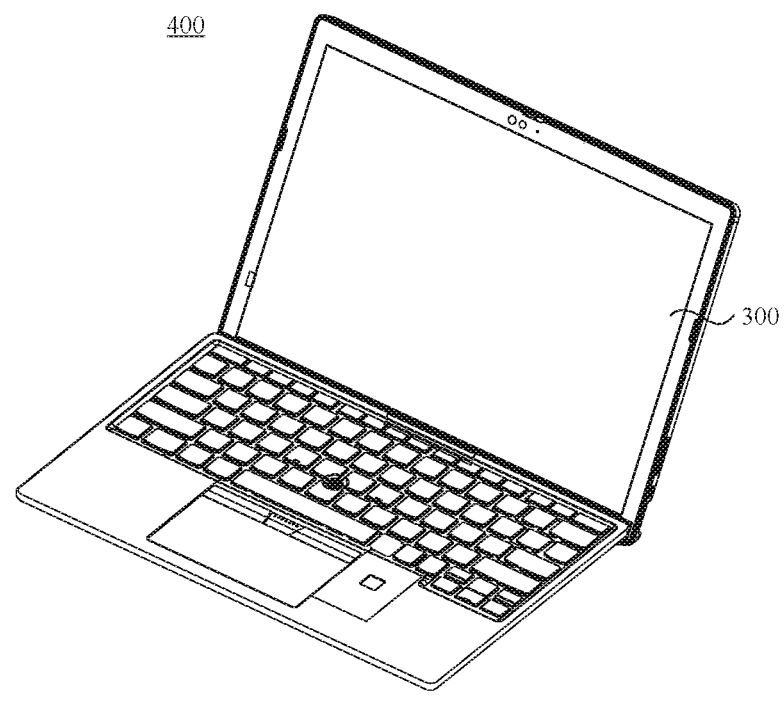
FIG. 5A is a structural diagram of a display device, in accordance with some embodiments.

FIG. 5A is a structural diagram of a display device, in accordance with some embodiments.

In yet another aspect, as shown in FIG. 5A, embodiments of the present disclosure provide a display device 400. The display device 400 includes the above display module 300, and thus has all the above beneficial effects, which will not be repeated here.

In some examples, the display device 400 may be a notebook computer, a mobile telephone, a wireless device, a personal data assistant (PDA), a hand-held or portable computer, a global positioning system (GPS) receiver/navigator, a camera, an MP4 video player, a camcorder, a game console, a watch, a clock, a calculator, a television monitor, a flat panel display, a computer monitor, an automotive display (e.g., an odometer display), a navigator, a cockpit controller and/or display, a camera view display (e.g., a rear view camera display in a vehicle), an electronic photo, an electronic billboard or sign, a projector, a packaging and aesthetic structure (e.g., a display for displaying an image of a piece of jewelry).

Figure 5B:
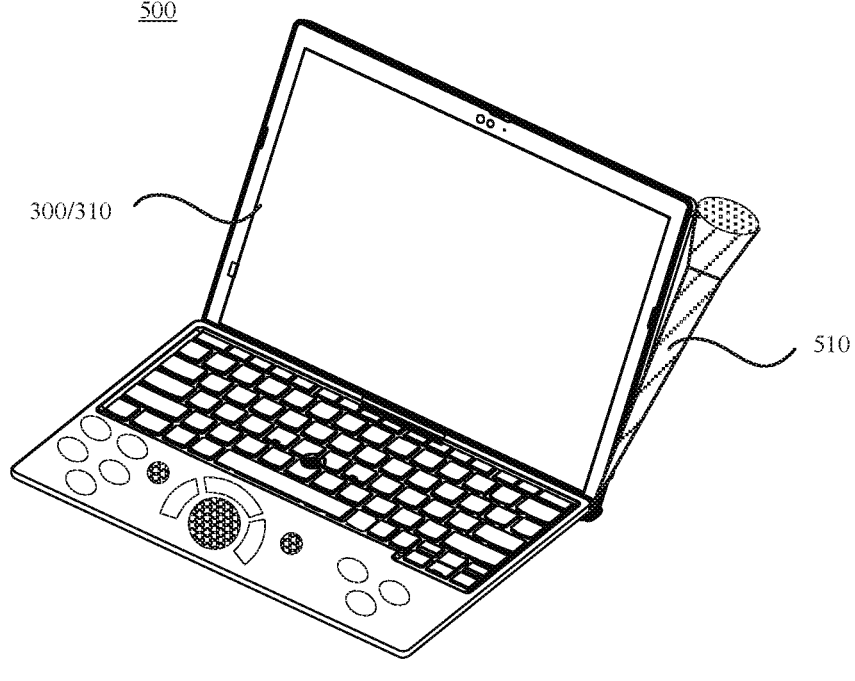
FIG. 5B is a structural diagram of an ultrasonic display device, in accordance with some embodiments.

FIG. 5B is a structural diagram of an ultrasonic display device, in accordance with some embodiments.

In yet another aspect, embodiments of the present disclosure provide an ultrasonic display device 500. The ultrasonic display device 500 includes the above display module 300, and thus has all the above beneficial effects, which will not be repeated here.

For example, the ultrasonic display device 500 includes a scan device 510, and the scan device 510 is used for scanning a human body or an animal to realize an ultrasonic display function.

In some examples, the ultrasonic display device 500 is a portable ultrasonic display device. It will be understood that, the portable ultrasonic display device has advantages of being portable and easy to operate. The portable ultrasonic display device may be used by non-ultrasonic clinicians and grass-roots doctors in hospitals, or may be arranged in ambulances, emergency and outpatient services for initial screening of diseases and emergency first aid to improve the diagnosis efficiency.

For example, the display panel 310 of the portable ultrasonic display device has a size of 18.5 inches, and has advantages of lightness, thinness, and narrow bezel.

The foregoing descriptions are only specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display module, comprising:

a display panel;

a driving circuit board including a circuit board body and at least one bonding component; wherein the circuit board body has a first main surface and a second main surface opposite to each other; a bonding component is located on the first main surface; the circuit board body has a first edge and a second edge opposite to each other, and the first edge is closer to a bonding side of the display panel than the second edge; the circuit board body is provided with at least one receiving structure therein; a receiving structure has at least an opening in the first main surface, and the opening of the receiving structure is closer to the first edge than the bonding component;

a flexible printed circuit; wherein an end of the flexible printed circuit is bonded to the bonding side of the display panel, and another end of the flexible printed circuit is bonded to the bonding component; and a driving chip installed on the flexible printed circuit and located on a side of the flexible printed circuit proximate to the driving circuit board; wherein an orthographic projection of the driving chip on a first reference plane is located inside an orthographic projection of the opening on the first reference plane; the first reference plane is a plane parallel to the first main surface.

2. The display module according to claim 1, wherein the driving chip passes through the opening, and is at least partially located in the receiving structure; and/or the receiving structure penetrates the circuit board body in a direction from the first main surface to the second main surface.

3. The display module according to claim 1, wherein a distance between the opening and the first edge is less than a distance between the opening and the second edge.

4. The display module according to claim 3, wherein the first edge includes a plurality of sub-edges that are spaced apart from each other; and the receiving structure includes a sidewall surface connected between two adjacent sub-edges, and at least a portion of the sidewall surface extends in a direction towards the second edge.

5. The display module according to claim 4, wherein the two adjacent sub-edges include a first sub-edge and a second sub-edge; the sidewall surface includes:

a first wall surface; wherein an end of the first wall surface is connected to an end of the first sub-edge proximate to the second sub-edge, and another end of the first wall surface extends in the direction towards the second edge;

a second wall surface; wherein an end of the second wall surface is connected to an end of the second sub-edge proximate to the first sub-edge, and another end of the second wall surface extends in the direction towards the second edge; and a third wall surface; wherein an end of the third wall surface is connected to an end of the first wall surface away from the first sub-edge, and another end of the third wall surface is connected to an end of the second wall surface away from the second sub-edge.

6. The display module according to claim 5, wherein in a direction from the first edge to the second edge, a distance between the first wall surface and the second wall surface is reduced.

7. The display module according to claim 5, wherein the first wall surface and the third wall surface have a first included angle therebetween, and the first included angle is an obtuse angle; the second wall surface and the third wall surface have a second included angle therebetween, and the second included angle is an obtuse angle; and/or the first wall surface and the first sub-edge have a third included angle therebetween, and the third included angle is an obtuse angle; the second wall surface and the second sub-edge have a fourth included angle therebetween, and the fourth included angle is an obtuse angle.

8. The display module according to claim 5, wherein the bonding component includes a plurality of connection pins that are sequentially arranged at intervals in a direction parallel to the second edge; at least some of the connection pins are located between the third wall surface and the second edge; in an extending direction of the second edge, the bonding component extends beyond at least one end of the third wall surface.

9. The display module according to claim 8, wherein in a direction from the first edge to the second edge, a distance between the bonding component and the third wall surface is greater than a distance between the bonding component and the second edge.

10. The display module according to claim 5, wherein the circuit board body further includes a plurality of signal wirings; at least one signal wiring includes:

first portion signal wirings; wherein an extending direction of a first portion signal wiring is same as an extending direction of an orthographic projection of the first edge on the first reference plane;

second portion signal wirings; wherein a second portion signal wiring has a first second portion signal wiring connection end and a second second portion signal wiring connection end; the first second portion signal wiring connection end is electrically connected to the first portion signal wiring; and a third portion signal wiring; wherein the third portion signal wiring is electrically connected to the second second portion signal wiring connection end; an extending direction of the third portion signal wiring is same as an extending direction of an orthographic projection of the third wall surface on the first reference plane; and the second portion signal wiring and the first portion signal wiring have a fifth included angle therebetween, and the fifth included angle is an obtuse angle; the second portion signal wiring and the third portion signal wiring have a sixth included angle therebetween, and the sixth included angle is an obtuse angle.

11. The display module according to claim 5, wherein driving circuit board further includes a plurality of electronic elements; the plurality of electronic elements include:

a connector; and a timing controller electrically connected to the connector; wherein one of the connector and the timing controller is located on the first main surface, and another one of the connector and the timing controller is located on the second main surface; an orthographic projection of the connector on the first reference plane and an orthographic projection of the timing controller on the first reference plane have a first distance therebetween, and a value of the first distance is in a range of 8 mm to 12 mm, inclusive.

12. The display module according to claim 11, wherein the circuit board body further includes a power signal wiring; the plurality of electronic elements further include:

a power driving chip electrically connected to the connector; and a third filter arranged adjacent to the bonding component; wherein an input end of the third filter is electrically connected to the power driving chip through the power signal wiring, and an output end of the third filter is electrically connected to the bonding component.

13. The display module according to claim 12, wherein the third filter is located on a side of the bonding component away from the second edge, and is located on the second main surface.

14. The display module according to claim 12, wherein the power signal wiring includes a second wiring segment; the second wiring segment includes:

a first portion power signal wiring; wherein an extending direction of the first portion power signal wiring is same as an extending direction of an orthographic projection of the first edge on the first reference plane;

a second portion power signal wiring; wherein the second portion power signal wiring has a first second portion power signal wiring connection end and a second second portion power signal wiring connection end; the first second portion power signal wiring connection end is electrically connected to the first portion power signal wiring; and a third portion power signal wiring; wherein the third portion power signal wiring is electrically connected to the second second portion power signal wiring connection end; an extending direction of the third portion power signal wiring is same as an extending direction of an orthographic projection of the third wall surface on the first reference plane; and the second portion power signal wiring and the first portion power signal wiring have a ninth included angle therebetween, and the ninth included angle is an obtuse angle; the second portion power signal wiring and the third portion power signal wiring have a tenth included angle therebetween, and the tenth included angle is an obtuse angle; and/or the power signal wiring includes a third wiring segment; the third wiring segment includes:

a fourth portion power signal wiring; wherein an extending direction of the fourth portion power signal wiring is same as an extending direction of an orthographic projection of the first sub-edge on the first reference plane;

a fifth portion power signal wiring; wherein the fifth portion power signal wiring has a first fifth portion power signal wiring connection end and a second fifth portion power signal wiring connection end; the first fifth portion power signal wiring connection end is electrically connected to the fourth portion power signal wiring;

a sixth portion power signal wiring; wherein the sixth portion power signal wiring has a first sixth portion power signal wiring connection end and a second sixth portion power signal wiring connection end; the first sixth portion power signal wiring connection end is electrically connected to the second fifth portion power signal wiring connection end; an extending direction of the sixth portion power signal wiring is same as the extending direction of the orthographic projection of the third wall surface on the first reference plane;

a seventh portion power signal wiring; wherein the seventh portion power signal wiring has a first seventh portion power signal wiring connection end and a second seventh portion power signal wiring connection end; the first seventh portion power signal wiring connection end is electrically connected to the second sixth portion power signal wiring connection end; and an eighth portion power signal wiring; wherein the eighth portion power signal wiring is electrically connected to the second seventh portion power signal wiring connection end; an extending direction of the eighth portion power signal wiring is same as an extending direction of an orthographic projection of the second sub-edge on the first reference plane; and the fifth portion power signal wiring and the fourth portion power signal wiring have an eleventh included angle therebetween, and the eleventh included angle is an obtuse angle; the fifth portion power signal wiring and the sixth portion power signal wiring have a twelfth included angle therebetween, and the twelfth included angle is an obtuse angle;

the seventh portion power signal wiring and the sixth portion power signal wiring have a thirteenth included angle therebetween, and the thirteenth included angle is an obtuse angle; the seventh portion power signal wiring and the eighth portion power signal wiring have a fourteenth included angle therebetween, and the fourteenth included angle is an obtuse angle.

15. The display module according to claim 12, wherein the circuit board body further has a third edge and a fourth edge opposite to each other; an end of the first edge is connected to the third edge, and another end of the first edge is connected to the fourth edge; an end of the second edge is connected to an end of the third edge away from the first edge, and another end of the second edge is connected to an end of the fourth edge away from the first edge;

the at least one receiving structure includes a plurality of receiving structures, and the plurality of receiving structures are spaced apart along an extending direction of the second edge; wherein the plurality of receiving structures include a first receiving structure and a second receiving structure, and the second receiving structure is closer to the third edge than the first receiving structure;

the at least one bonding component includes a plurality of bonding components, and the plurality of bonding components are spaced apart along the extending direction of the second edge; wherein the plurality of bonding components include a first bonding component and a second bonding component, and the second bonding component is closer to the third edge than the first bonding component; at least a portion of the first bonding component is located between the first receiving structure and the second edge, and at least a portion of the second bonding component is located between the second receiving structure and the second edge;

the connector and the timing controller are located among the first receiving structure, the second receiving structure, the first bonding component and the second bonding component; the power driving chip is located on a side of the second receiving structure proximate to the third edge.

16. The display module according to claim 11, wherein the circuit board body further includes a driving signal wiring; the plurality of electronic elements further include:

a first filter arranged adjacent to the bonding component; wherein an input end of the first filter is electrically connected to an end of the driving signal wiring, and an output end of the first filter is electrically connected to the bonding component; and a second filter arranged adjacent to the timing controller; wherein an input end of the second filter is electrically connected to the timing controller, and an output end of the second filter is electrically connected to an end of the driving signal wiring away from the first filter.

17. The display module according to claim 16, wherein the first filter is located on a side of the bonding component away from the second edge, and is located on the second main surface.

18. The display module according to claim 16, wherein the driving signal wiring includes a first wiring segment; the first wiring segment includes:

a first portion driving signal wiring; wherein an extending direction of the first portion driving signal wiring is same as an extending direction of an orthographic projection of the first edge on the first reference plane;

a second portion driving signal wiring; wherein the second portion driving signal wiring has a first second portion driving signal wiring connection end and a second second portion driving signal wiring connection end; the first second portion driving signal wiring connection end is electrically connected to the first portion driving signal wiring; and a third portion driving signal wiring; wherein the third portion driving signal wiring is electrically connected to the second second portion driving signal wiring connection end; an extending direction of the third portion driving signal wiring is same as an extending direction of an orthographic projection of the third wall surface on the first reference plane; and the second portion driving signal wiring and the first portion driving signal wiring have a seventh included angle therebetween, and the seventh included angle is an obtuse angle; the second portion driving signal wiring and the third portion driving signal wiring have an eighth included angle therebetween, and the eighth included angle is an obtuse angle.

19. A display device, comprising the display module according to claim 1.

\*    \*    \*    \*    \*